(12) United States Patent
Maffeis

(10) Patent No.: US 9,722,635 B2
(45) Date of Patent: Aug. 1, 2017

(54) CONTROLLER FOR A SOLID-STATE DRIVE, AND RELATED SOLID-STATE

(71) Applicant: NandEXT S.r.l., Località Dogana (SM)

(72) Inventor: Margherita Maffeis, Dalmine (IT)

(73) Assignee: NandEXT Srl, San Marino ( * ) Notice: Subject to any disclaimer, the term of this patent is extended or adjusted under 35 U.S.C. 154(b) by 43 days.

(21) Appl. No.: 14/789,522

(22) Filed: Jul. 1, 2015

(65) Prior Publication Data
US 2017/0004033 A1    Jan. 5, 2017

(51) Int. Cl.
| | |
|---|---|
| G06F 11/00 | (2006.01) |
| H03M 13/00 | (2006.01) |
| H03M 13/41 | (2006.01) |
| H03M 13/11 | (2006.01) |
| G06F 11/10 | (2006.01) |
| G11C 7/04 | (2006.01) |
| H03M 13/23 | (2006.01) |
| G11C 29/52 | (2006.01) |
| G11C 29/04 | (2006.01) |

(52) U.S. Cl.
CPC ..... *H03M 13/4146* (2013.01); *G06F 11/1072* (2013.01); *G11C 7/04* (2013.01); *H03M 13/116* (2013.01); *H03M 13/1111* (2013.01); *H03M 13/23* (2013.01); *H03M 13/4138* (2013.01); *H03M 13/635* (2013.01); *G11C 29/52* (2013.01); *G11C 2029/0411* (2013.01)

(58) Field of Classification Search
CPC ............. G06F 11/1056; G06F 11/1068; G06F 11/1072; G06F 11/108; G06F 3/0619; G11C 29/52; H03M 13/23; H03M 13/4138; H03M 13/4146
See application file for complete search history.

(56) References Cited

U.S. PATENT DOCUMENTS

| | | | | |
|---|---|---|---|---|
| 8,429,500 B2* | 4/2013 | Haratsch | ............. | H03M 13/612 714/709 |
| 8,825,945 B2* | 9/2014 | Chilappagari | ...... | G11C 11/5621 711/101 |
| 8,848,442 B2* | 9/2014 | Sharon | ................ | G06F 11/1072 365/185.03 |
| 2013/0283128 A1* | 10/2013 | Lee | ..................... | G06F 11/1068 714/773 |

\* cited by examiner

*Primary Examiner* — Shelly A Chase
(74) *Attorney, Agent, or Firm* — Janeway Patent Law PLLC

(57) ABSTRACT

A controller for a solid state drive is proposed. The solid state drive comprises memory cells each one for storing a symbol among a plurality of possible symbols that the memory cell is designed to store. The controller comprises
  a unit for encoding information bits into encoded bits;
  a unit for mapping the encoded bits into the symbols, wherein the symbols are determined based on a plurality of allowed symbols, among the possible symbols, that the memory cells are allowed to store, whereas the symbols, among the possible symbols, other than the allowed symbols define forbidden symbols not allowed to be stored in the memory cells;
  a unit for demapping read symbols and for providing an indication of the reliability of the read symbols based on the forbidden symbols; and
  a unit for soft decoding the read symbols according to the reliability indication thereby obtaining the information bits.

22 Claims, 14 Drawing Sheets

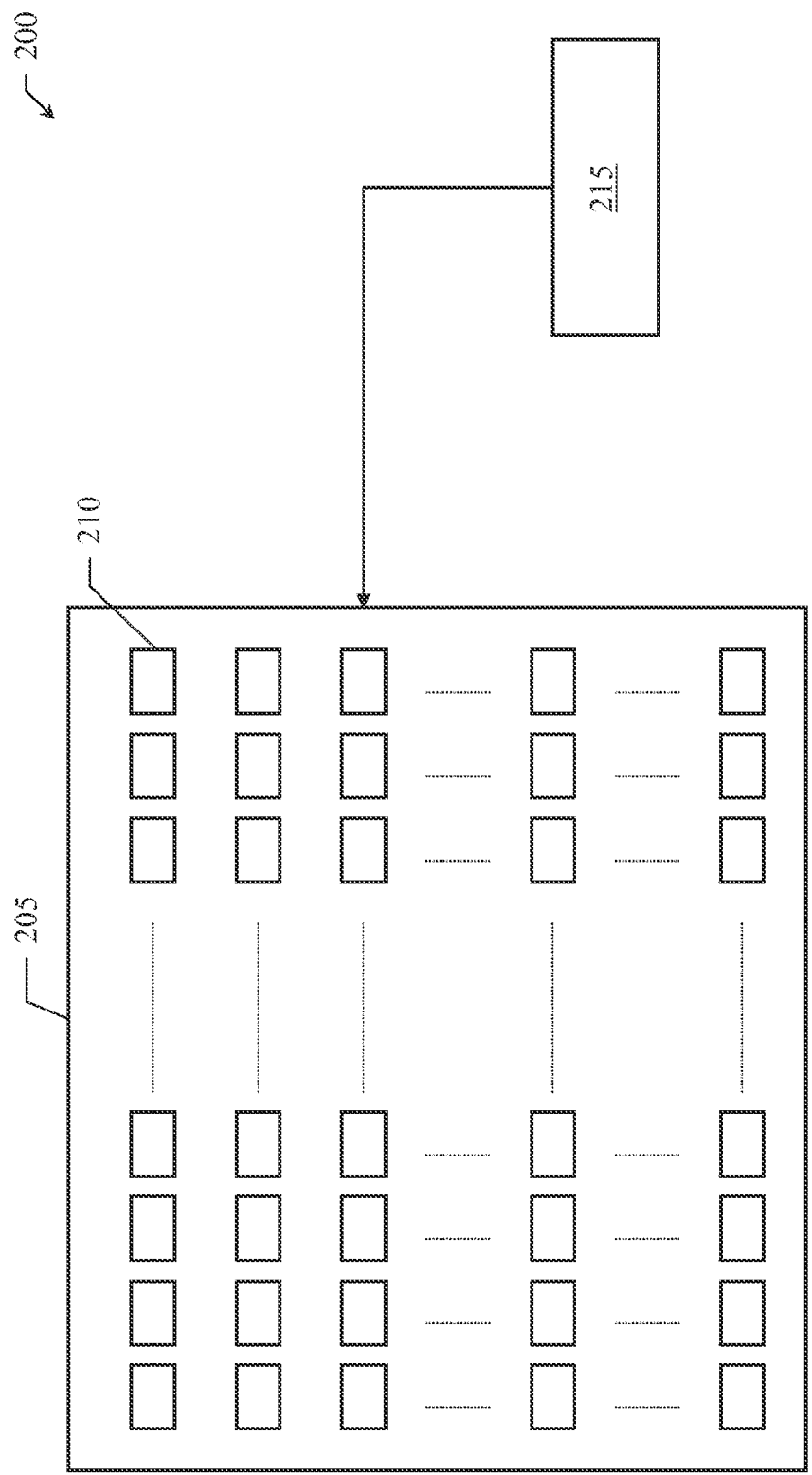

Figure 1A:
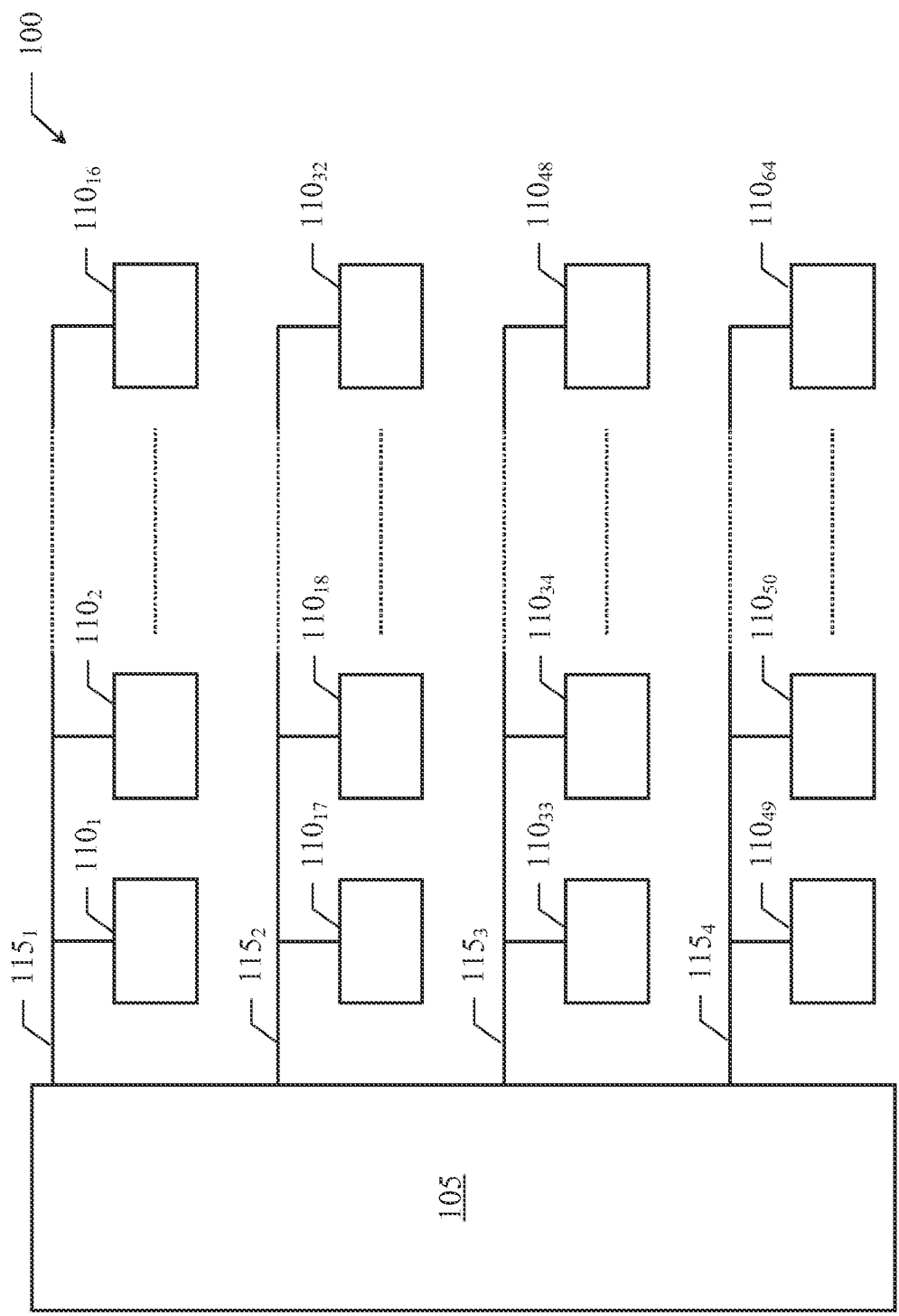

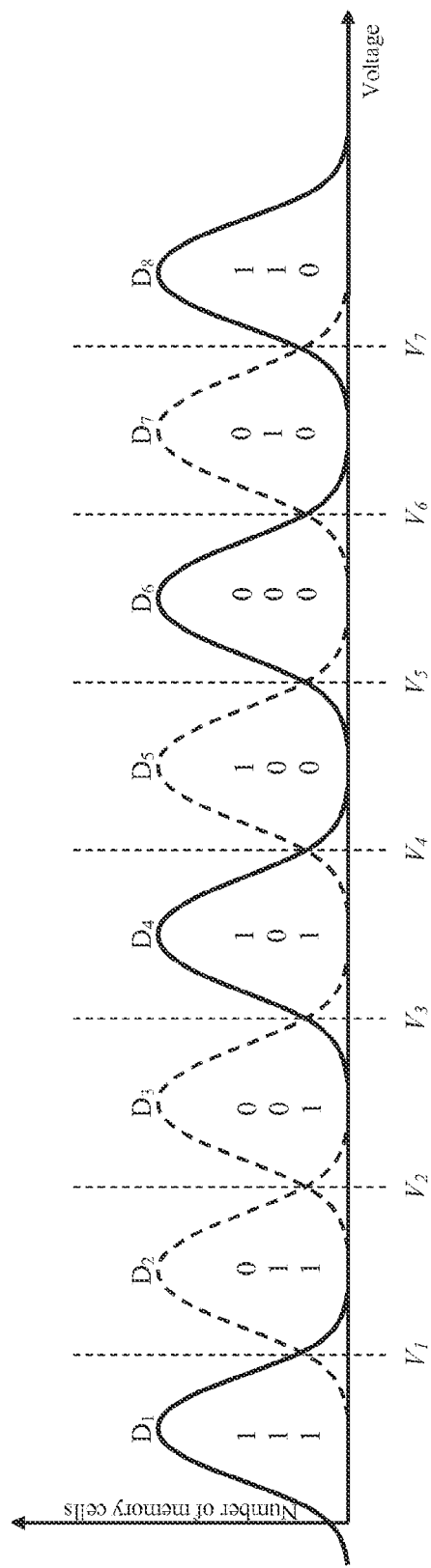
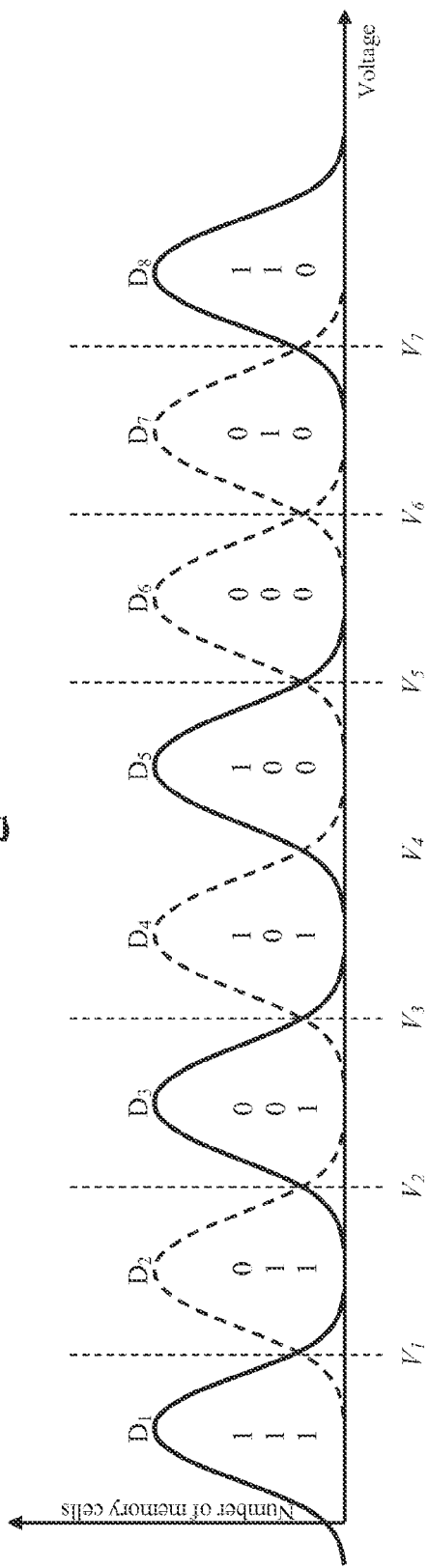

CONTROLLER FOR A SOLID-STATE DRIVE, AND RELATED SOLID-STATE

BACKGROUND OF THE INVENTION

Field of the Invention

The present invention generally relates to "Solid State Drives" (hereinafter, SSD devices), such as SSD devices provided with non-volatile memory chips (e.g., NAND flash memory chips) for storing data. More particularly, the present invention relates to SSD devices provided with error correction capabilities.

Overview of the Related Art

SSD devices are nowadays widely used, for example as storage units of computers in replacement of HDD ("Hard Disk Drives").

A common SSD device comprises non-volatile memory chips (for example, NAND flash memory chips) each one including non-volatile memory cells for storing data (bits) even in the absence of external power supply, and a SSD device controller (hereinafter, SSD controller) for managing SSD device operations, such as write/program, erase and read operations.

Each memory cell comprises a floating gate transistor. Each bit or group of bits (identifying a respective logical state of the memory cell) is physically stored in each memory cell in the form of electric charge in the floating gate, which defines a corresponding threshold voltage of the transistor. The number of bits each memory cell is capable of storing depends on memory cell technology. For example, in "Single-Level Cell" (SLC) technology each memory cell (or SLC memory cell) is capable of storing one symbol comprising one bit (i.e. two logical states, 0 or 1, defining two threshold voltages), in "Multi-Level Cell" (MLC) technology each memory cell (or MLC memory cell) is capable of storing one symbol comprising more than one bit, typically two bits (i.e. four logical states, 00, 01, 10, or 11, defining four threshold voltages), whereas in "Tri-Level Cell" technology each memory cell (or TLC memory cell) is capable of storing one symbol comprising three bits (i.e. eight logical states, 000, 001, 010, 011, 100, 101, 110 or 111, defining eight threshold voltages).

While, ideally, all memory cells in a memory chip should feature same (nominal) threshold voltages for same logical states (or, equivalently, for same symbols), practically each threshold voltage associated with a corresponding logical state (or, equivalently, with a corresponding symbol) differs across the memory cells and defines a respective threshold voltage distribution (typically, a Gaussian-type probability distribution), thus resulting in a number of threshold voltage distributions equal to the possible logical states each memory cell can take.

Ideally, the threshold voltage distributions are spaced apart from one another, and a corresponding reference voltage is set between each pair of adjacent threshold voltage distributions for sensing/reading the logical state of the memory cells. This is schematically shown in the top drawing of FIG. 2B for a 2-bit MLC memory cell (hereinafter referred to as MLC memory cell for the sake of conciseness) and in the top drawing of FIG. 2C for a TCL memory cell. In such figures the threshold voltage distributions are denoted by $D_j$ (j ranging from 1 to 4 for the MLC memory cell and from 1 to 8 for the TLC memory cell).

Figure 2B:
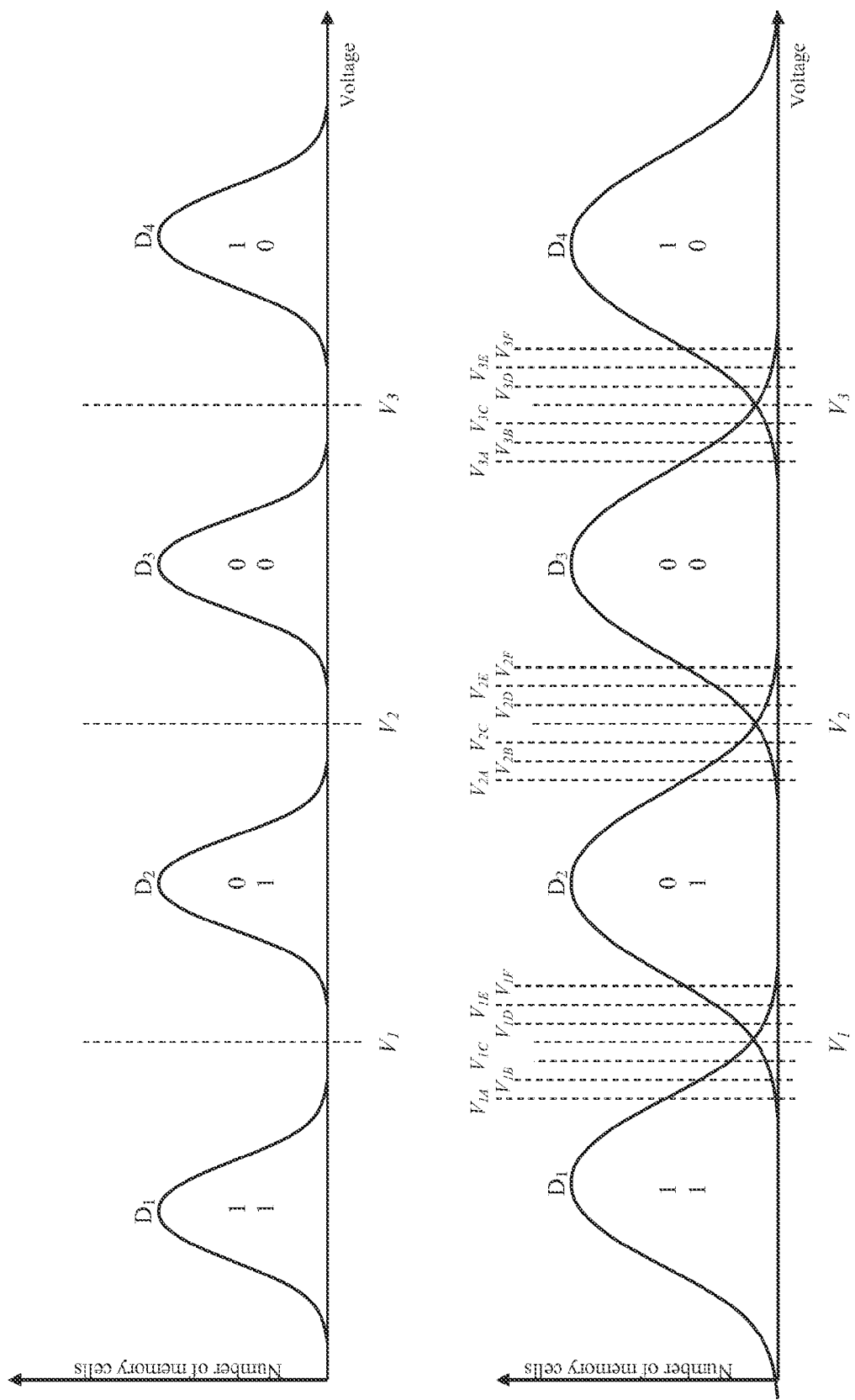
Figure 2C:
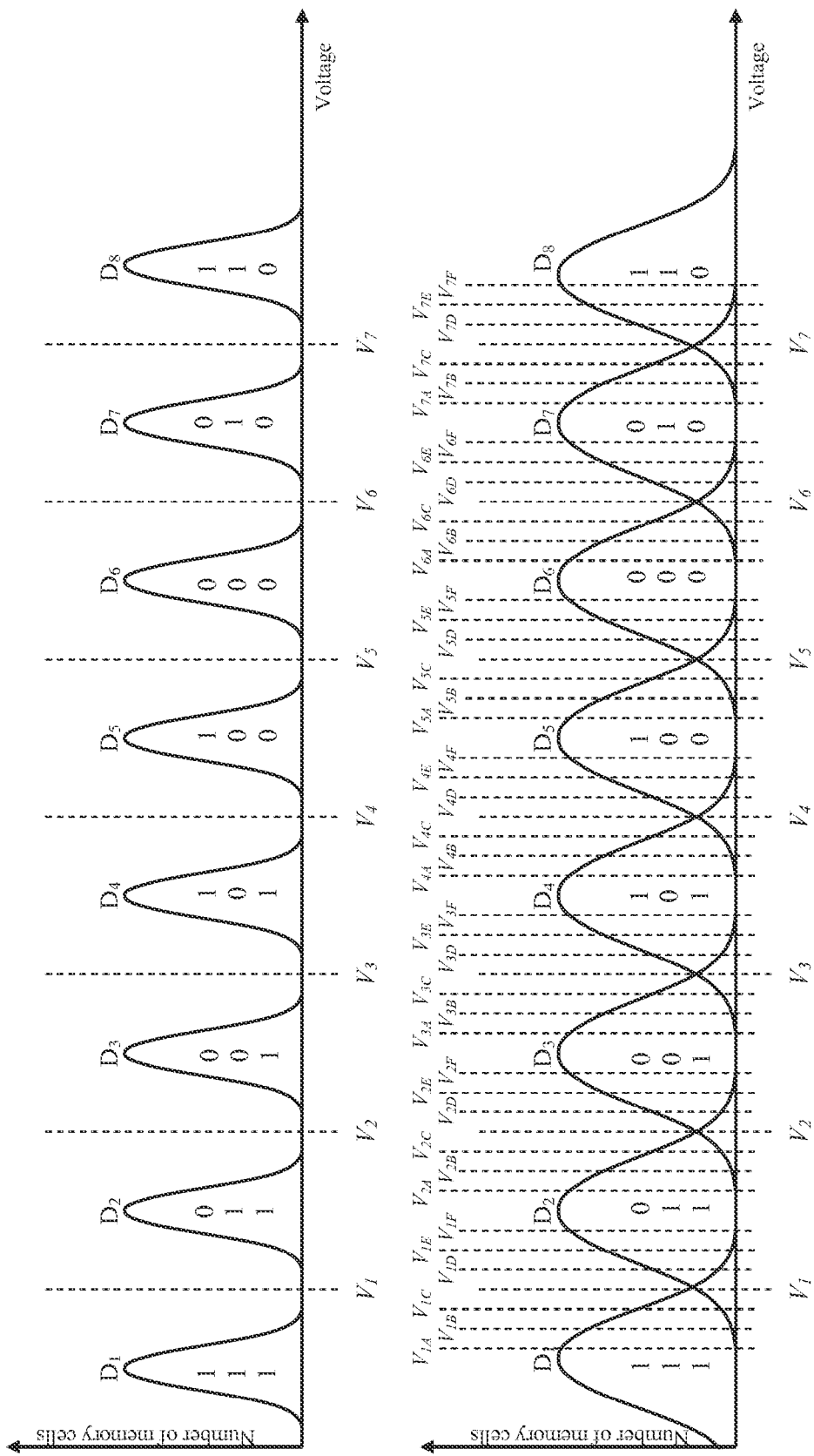

As visible in these drawings, the threshold voltage distributions $D_j$ are (ideally) spaced apart from one another, and a corresponding reference voltage $V_k$ is set between each pair of adjacent threshold voltage distributions $D_j$ for sensing/reading the logical state of the memory cells (k=1, 2, 3 in the example of FIG. 2B and k=1, 2, 3, 4, 5, 6, 7 in the example of FIG. 2C).

In case of the MLC memory cell, during a reading operation a threshold voltage below the reference voltage $V_1$ represents the bit pattern "11", a threshold voltage between the reference voltages $V_1$ and $V_2$ represents the bit pattern "01", a threshold voltage between the reference voltages $V_2$ and $V_3$ represents the bit pattern "00", and a threshold voltage above the reference voltage $V_3$ represents the bit pattern "10".

In case of the TLC memory cell, during a reading operation, a threshold voltage below the reference voltage $V_1$ represents the bit pattern "111", a threshold voltage between the reference voltages $V_1$ and $V_2$ represents the bit pattern "011", a threshold voltage between the reference voltages $V_2$ and $V_3$ represents the bit pattern "001", a threshold voltage between the reference voltages $V_3$ and $V_4$ represents the bit pattern "101", a threshold voltage between the reference voltages $V_4$ and $V_5$ represents the bit pattern "100", a threshold voltage between the reference voltages $V_5$ and $V_6$ represents the bit pattern "000", a threshold voltage between the reference voltages $V_6$ and $V_7$ represents the bit pattern "010", and a threshold voltage above the reference voltage $V_7$ represents the bit pattern "110".

To read a memory cell, the threshold voltage of the memory cell is compared to the reference voltages $V_k$. Typically, reading a memory cell that stores a bit symbol of m bits requires, for at least one page of memory cells (hereinafter, memory page), m such comparisons.

For example, when m=3, such as in the TLC memory cell, the threshold voltage is first compared to the reference voltage $V_4$. Depending on the outcome of that comparison, the threshold voltage is then compared either to the reference voltage $V_2$ or to the reference voltage $V_6$. Depending on the outcome of the second comparison, the threshold voltage is then compared either to the reference voltages $V_1$ or $V_3$ or to the reference voltages $V_5$ or $V_7$.

However, the increasing of the number of bits per memory cell causes, for a same threshold voltage distribution space (i.e., for the same allowed maximum and minimum threshold voltages), a higher number of threshold voltage distributions. A higher number of threshold voltage distributions in the same threshold voltage distribution space results in threshold voltage distributions that are closer to each other. This makes the memory cells more prone to suffer severe cell-to-cell interference and retention noise, which translates into partially overlapping areas of adjacent threshold voltage distributions $D_j$ (shown in the bottom drawings of FIGS. 2B and 2C) and, hence, into the increasing of the number of bit errors.

In order to compensate for larger bit errors, and to increase SSD device reliability, "Forward Error Correction" has been proposed (and typically implemented in the SSD controller) for locating and correcting bit errors. According to "Forward Error Correction" principles, the bits to be stored are encoded in a redundant way (e.g., by adding parity bits) by means of an "Error Correction Code" (ECC code), so that redundancy allows detecting a limited number of bit errors that may occur anywhere in the read bits, and to correct these errors without rereading. Generally, the number of detectable and correctable bit errors increases as the number of parity bits in the ECC code increases.

The probability of corrupted read bits, which therefore contains incorrect bits, before correction is referred to as "Raw Bit Error Rate" (RBER). As a result of the advances in memory cell technology, the RBER for a selected page of memory cells (hereinafter, memory page) is increasingly nearing the Shannon limit of the communication channel. The RBER observed after application of the ECC code is referred to as "Frame Bit Error Rate" (FER), whereas the FER divided by the number of read bits an is referred to as "Uncorrectable Bit Error Rate" (UBER).

The acceptable UBER is often dependent upon the application in which the SSD device is intended to be employed. In the case of price sensitive, consumer applications, which experience a relatively low number of accesses (e.g., program/erase cycles), the SSD device may tolerate a higher UBER as compared to a high-end application experiencing a relatively high number of accesses, such as an enterprise application.

To achieve an acceptable UBER, especially for enterprise applications, "Low-Density Parity-Check" (LDPC) codes have been widely used (both alone and in combination with other ECC codes), which allow determining each bit value (hard decoding) as well as each bit reliability (soft decoding) in terms of soft bits.

For example, according to a known solution, the SSD controller comprises a hard encoding unit for hard encoding the bits to be stored/written by means of a hard ECC code, such as "Bose-Chaudhuri-Hocquenghem" (BCH) code (the hard encoding unit and the hard encoded bits being thus referred to as BCH encoding unit and BCH encoded bits, respectively), and a LDPC encoding unit for encoding the BCH encoded bits by means of the LDPC code. The SSD controller also comprises soft decoding and hard decoding units for carrying out soft decoding and hard decoding operations (based on LDPC and BCH codes, respectively) on the read bits (the soft decoding and hard decoding units being thus referred to as LDPC decoding and BCH decoding units, respectively).

In this solution, the soft bits mainly arise from multiple reading operations. Indeed, according to a common approach, when a reading operation takes place on a selected memory page, and the number of bit errors is found to be higher than correction capabilities of the "Forward Error Correction", the flash memory device (e.g., the SSD controller thereof) is typically configured to reread the selected memory page at different values of the reference voltages to attempt to establish the bits in those areas of the threshold voltage distributions $D_j$ wherein bit error is most likely. Such multiple readings are typically carried out by moving the reference voltages $V_k$ in a neighborhood thereof, thus obtaining a number of (e.g. six, as exemplary shown in the bottom drawings of FIGS. 2B and 2C) additional reference voltages $V_{kA}$-$V_{kF}$ associated with each reference voltage $V_k$ (in the following, the overall reference voltages including both the reference voltages $V_k$ and the associated additional reference voltages $V_{kA}$-$V_{kF}$ will be denoted by reference voltages $V_{kA}$, $V_{kA}$-$V_{kF}$ for the sake of conciseness).

SUMMARY OF THE INVENTION

The Applicant has recognized that nowadays SSD devices based on MLC and TLC technologies (hereinafter, MLC and TLC SSD devices) are not satisfactory in terms of error correction capabilities (and, hence, in terms of UBER). Indeed, a high UBER translates into poor reliability and lifetime of the SSD device in terms of sustainable program/erase cycles.

Although decreasing the code rate (i.e., the ratio between the information bits to the (LDPC, in the case at issue) encoding unit and the total number of bits created by the encoding unit, the total number of bits created by the encoding unit including the parity bits) for BCH codes could seem a viable approach for increasing error correction capabilities, however this would reduce the storage capacity of the SSD device.

Moreover, LDPC decoding requires soft bits, which in the above-discussed solution translates into multiple readings. However moving the reference voltages $V_k$ could result in very expensive read access times for conventional LDPC decoding units. These issues are exacerbated in nowadays SSD devices, which are smaller and smaller and whose bits per memory cell are increasingly growing, as the narrow distance between the threshold voltage distributions $D_j$ requires more and more soft bits to make LDPC decoding unit work properly. For example, in a (2-bit) MLC SSD device, 3 reference voltages $V_k$ are needed for the BCH decoding unit and up to 21 references voltages $V_{kA}$, $V_{kA}$-$V_{kF}$ (as illustrated in the bottom drawing of FIG. 2B) or more thereof (depending on the desired resolution) are needed for the LDPC decoding unit, whereas in a TLC SSD device, 7 reference voltages $V_k$ are needed for the BCH decoding unit and up to 49 references voltages $V_{kA}$, $V_{kA}$-$V_{kF}$ (as illustrated in the bottom drawing of FIG. 2B) or more thereof (depending on the desired resolution) are needed for the LDPC decoding unit.

Last but not least, the Applicant has also understood that nowadays enterprise MLC and TLC SSD devices are excessively expensive as compared to their performance in terms of UBER. By way of example only, it could be estimated that an enterprise MLC SSD device cost is seven times higher than a consumer TLC SSD device.

The Applicant has tackled the above-discussed issues, and has devised a SSD controller for obtaining respective SSD devices having high error correction capabilities and low costs.

One or more aspects of the present invention are set out in the independent claims, with advantageous features of the same invention that are indicated in the dependent claims, whose wording is enclosed herein verbatim by reference (with any advantageous feature being provided with reference to a specific aspect of the present invention that applies mutatis mutandis to any other aspect thereof).

More specifically, an aspect of the present invention relates to a controller for a solid state drive. The solid state drive comprises memory cells each one for storing a symbol among a plurality of possible symbols that the memory cell is designed to store. The controller comprises:

an encoding unit for encoding information bits into encoded bits;

a mapping unit for mapping the encoded bits into said symbols, wherein said symbols are determined based on a plurality of allowed symbols that the memory cells are allowed to store, said plurality of allowed symbols being a subset of the plurality of the possible symbols such that a plurality of forbidden symbols not allowed to be stored in the memory cells are defined among the plurality of the possible symbols, a demapping unit for demapping read symbols and for providing an indication of the reliability of the read symbols based on said plurality of forbidden symbols, and a soft decoding unit for soft decoding the read symbols according to said indication of the reliability of the read symbols thereby obtaining said information bits.

According to an embodiment of the present invention, said indication of the reliability of the read symbols comprises, for each read symbol equal to a forbidden symbol of said plurality of forbidden symbols, an indication that the read symbol read from a memory cell is different from an original symbol originally stored in that memory cell.

According to an embodiment of the present invention, said indication of the reliability of the read symbols further comprises, for each read symbol equal to a forbidden symbol of said plurality of forbidden symbols, an indication of the probability that the original symbol is one of the plurality of the allowed symbols.

According to an embodiment of the present invention, the plurality of possible symbols define a succession of possible symbols, adjacent possible symbols of the succession differing from each other for one bit. At least one of the at least one allowed symbol of said plurality of allowed symbols is adjacent to at least one of the plurality of forbidden symbols, said indication of the probability that the original symbol is one of the plurality of allowed symbols comprising an indication of the probability that the original symbol is one of the at least one allowed symbol adjacent that forbidden symbol.

According to an embodiment of the present invention, said indication of the probability that the symbol originally stored is one of the at least one allowed symbol adjacent the forbidden symbol is provided according to at least one between an indication of a floating gate coupling effect and an indication of a retention effect that affect the memory cells.

According to an embodiment of the present invention, each memory cell comprises a floating gate transistor adapted to store a symbol, among the plurality of possible symbols, when programmed at a threshold voltage associated with that symbol, each threshold voltage being variable over the memory cells thereby defining a corresponding threshold voltage distribution. Said plurality of forbidden symbols are defined according to a criterion of maximization of distance between the threshold voltage distributions associated with the allowed symbols of said plurality of symbols.

According to an embodiment of the present invention, the controller further comprises a convolutional encoding unit for convolutionally encoding a first portion of the encoded bits into convolutionally encoded bits, said mapping unit being based on a 4-Dimensional mapping scheme applied to said convolutionally encoded bits and to a second portion of the encoded bits not convolutionally encoded.

According to an embodiment of the present invention, said demapping unit comprises a "Soft Output Viterbi Algorithm" (SOVA) unit.

According to an embodiment of the present invention, said encoding unit and said soft decoding unit are based on a "Low Density Parity Check" (LDPC) code.

According to an embodiment of the present invention, said encoding unit and said soft decoding unit are based on a "Quasi-Cyclic Low Density Parity Check" (QC LDPC) code.

Another aspect of the present invention relates to a solid state drive. The solid state drive comprises:

memory cells each one for storing a symbol among a plurality of possible symbols that the memory cell is designed to store, an encoding unit for encoding information bits into encoded bits;

a mapping unit for mapping the encoded bits into said symbols, wherein said symbols are determined based on a plurality of allowed symbols that the memory cells are allowed to store, said plurality of allowed symbols being a subset of the plurality of the possible symbols such that a plurality of forbidden symbols not allowed to be stored in the memory cells are defined among the plurality of the possible symbols, a demapping unit for demapping read symbols and for providing an indication of the reliability of the read symbols based on said plurality of forbidden symbols, and a soft decoding unit for soft decoding the read symbols according to said indication of the reliability of the read symbols thereby obtaining said information bits.

According to an embodiment of the present invention, said indication of the reliability of the read symbols comprises, for each read symbol equal to a forbidden symbol of said plurality of forbidden symbols, an indication that the read symbol read from a memory cell is different from an original symbol originally stored in that memory cell.

According to an embodiment of the present invention, said indication of the reliability of the read symbols further comprises, for each read symbol equal to a forbidden symbol of said plurality of forbidden symbols, an indication of the probability that the original symbol is one of the plurality of the allowed symbols.

According to an embodiment of the present invention, the plurality of possible symbols define a succession of possible symbols, adjacent possible symbols of the succession differing from each other for one bit. At least one of the at least one allowed symbol of said plurality of allowed symbols is adjacent to at least one of the plurality of forbidden symbols, said indication of the probability that the original symbol is one of the plurality of allowed symbols comprising an indication of the probability that the original symbol is one of the at least one allowed symbol adjacent that forbidden symbol.

According to an embodiment of the present invention, said indication of the probability that the symbol originally stored is one of the at least one allowed symbol adjacent the forbidden symbol is provided according to at least one between an indication of a floating gate coupling effect and an indication of a retention effect that affect the memory cells.

According to an embodiment of the present invention, each memory cell comprises a floating gate transistor adapted to store a symbol, among the plurality of possible symbols, when programmed at a threshold voltage associated with that symbol, each threshold voltage being variable over the memory cells thereby defining a corresponding threshold voltage distribution. Said plurality of forbidden symbols are defined according to a criterion of maximization of distance between the threshold voltage distributions associated with the allowed symbols of said plurality of symbols.

According to an embodiment of the present invention, the solid state drive further comprises a convolutional encoding unit for convolutionally encoding a first portion of the encoded bits into convolutionally encoded bits, said mapping unit being based on a 4-Dimensional mapping scheme applied to said convolutionally encoded bits and to a second portion of the encoded bits not convolutionally encoded.

According to an embodiment of the present invention, said demapping unit comprises a "Soft Output Viterbi Algorithm" (SOVA) unit.

According to an embodiment of the present invention, said encoding unit and said soft decoding unit are based on a "Low Density Parity Check" (LDPC) code.

According to an embodiment of the present invention, said encoding unit and said soft decoding unit are based on a "Quasi-Cyclic Low Density Parity Check" (QC LDPC) code.

According to an embodiment of the present invention, the memory cells are flash memory cells.

According to an embodiment of the present invention, said memory cells are NAND flash memory cells.

BRIEF DESCRIPTION OF THE ANNEXED DRAWINGS

Figure 1B:
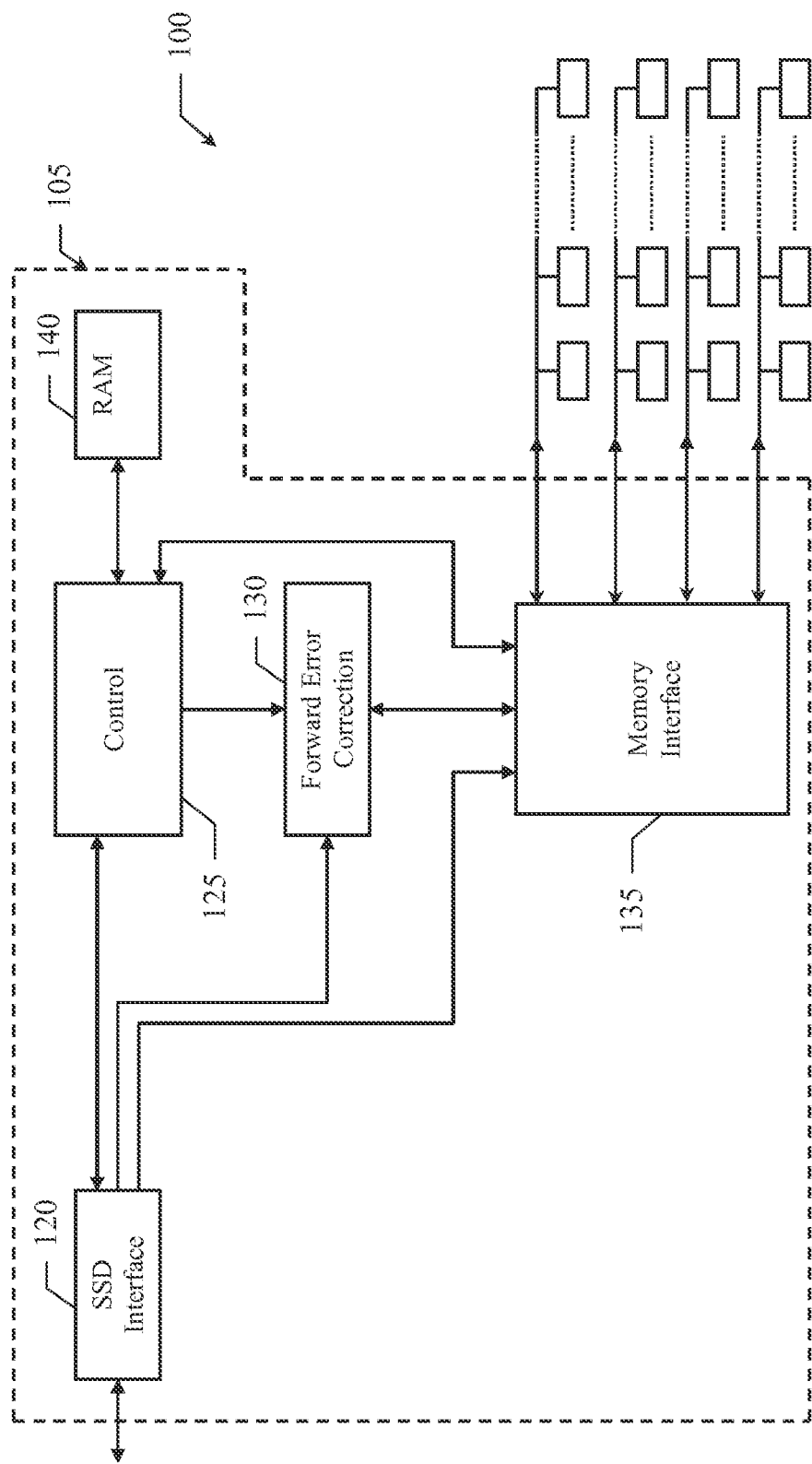
Figure 3A:
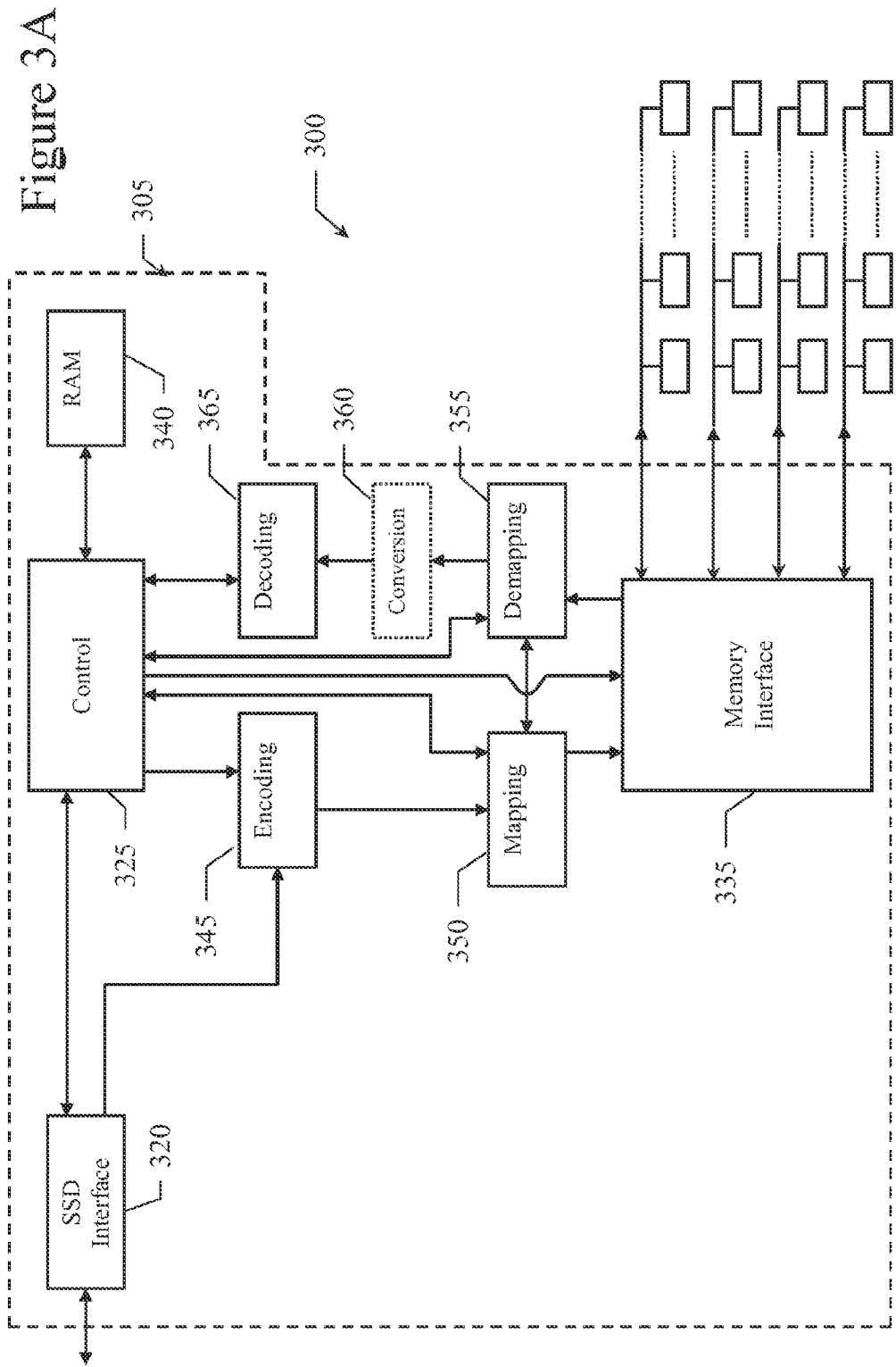
Figure 3B:
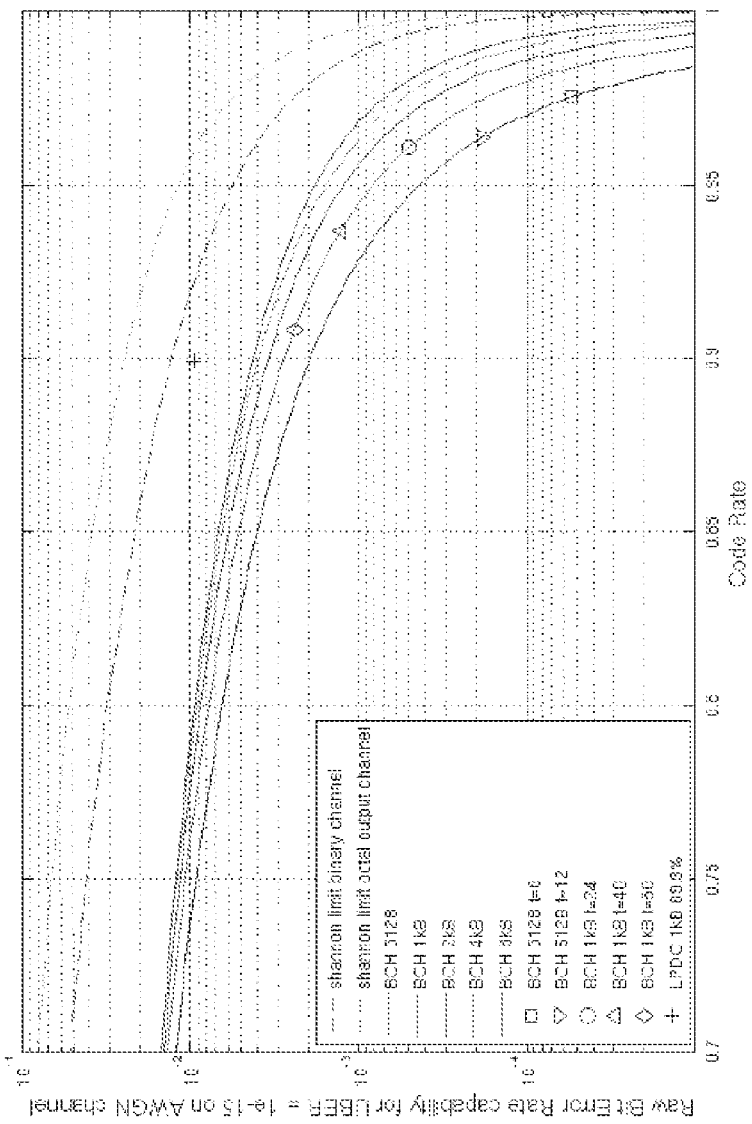
Figure 4C:
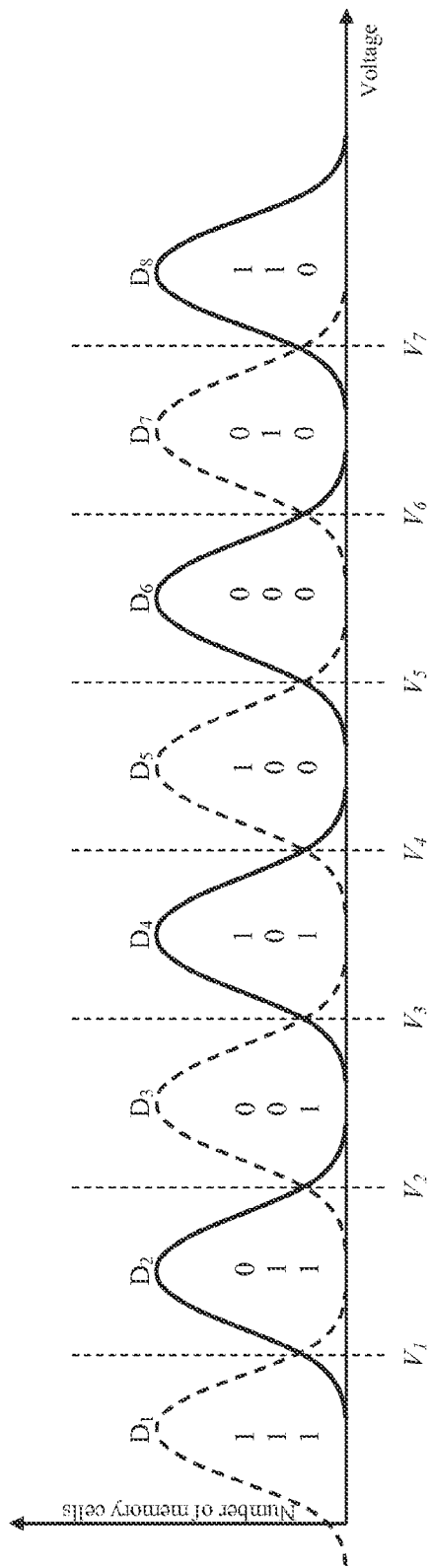
Figure 4D:
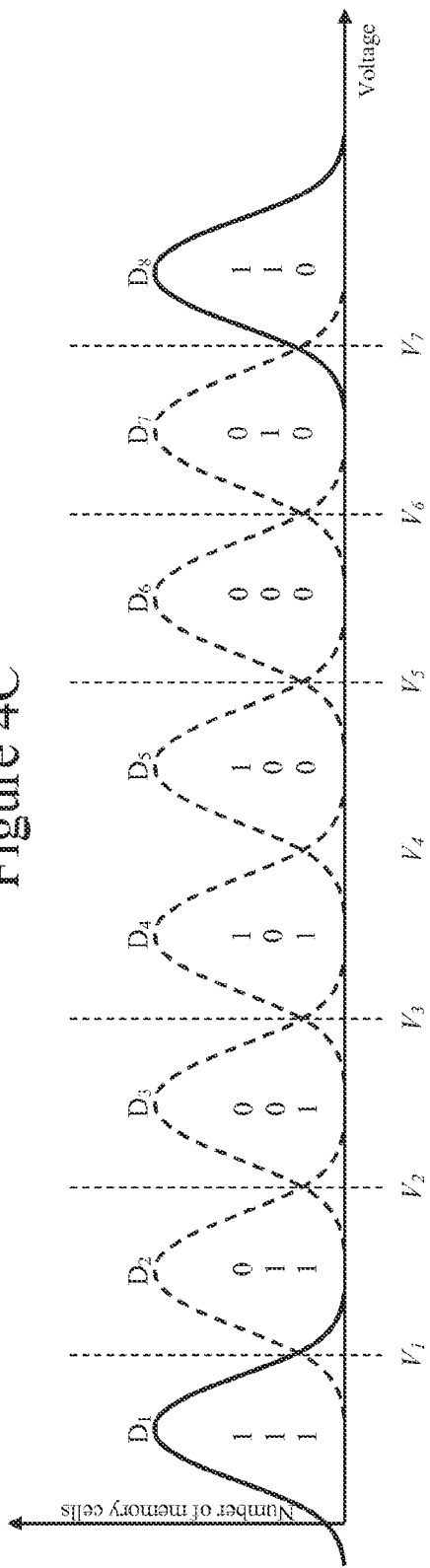
Figure 4E:
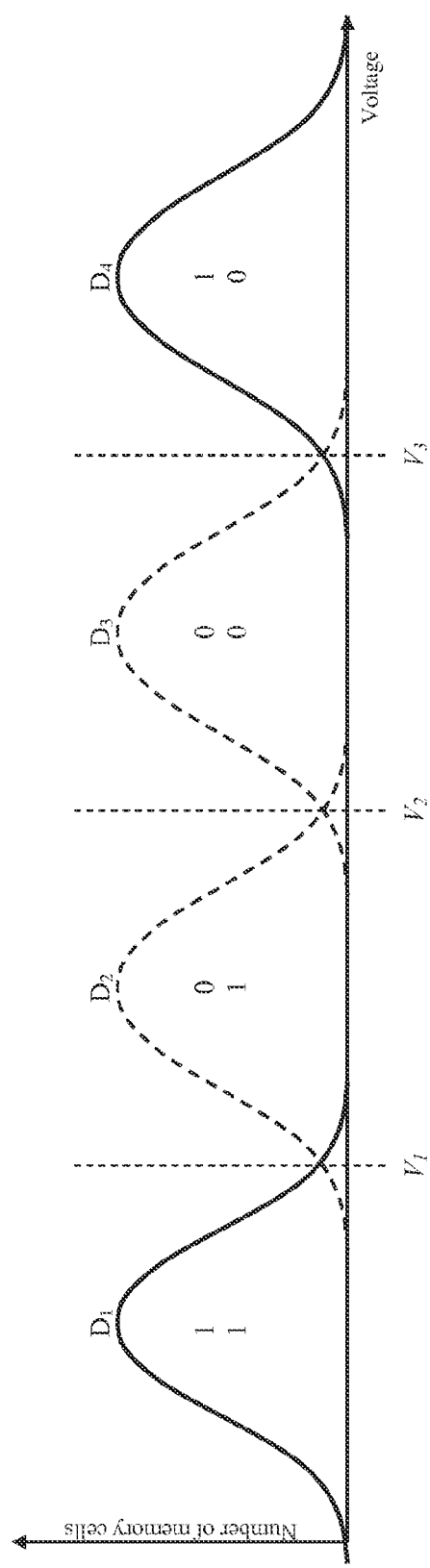
Figure 4F:
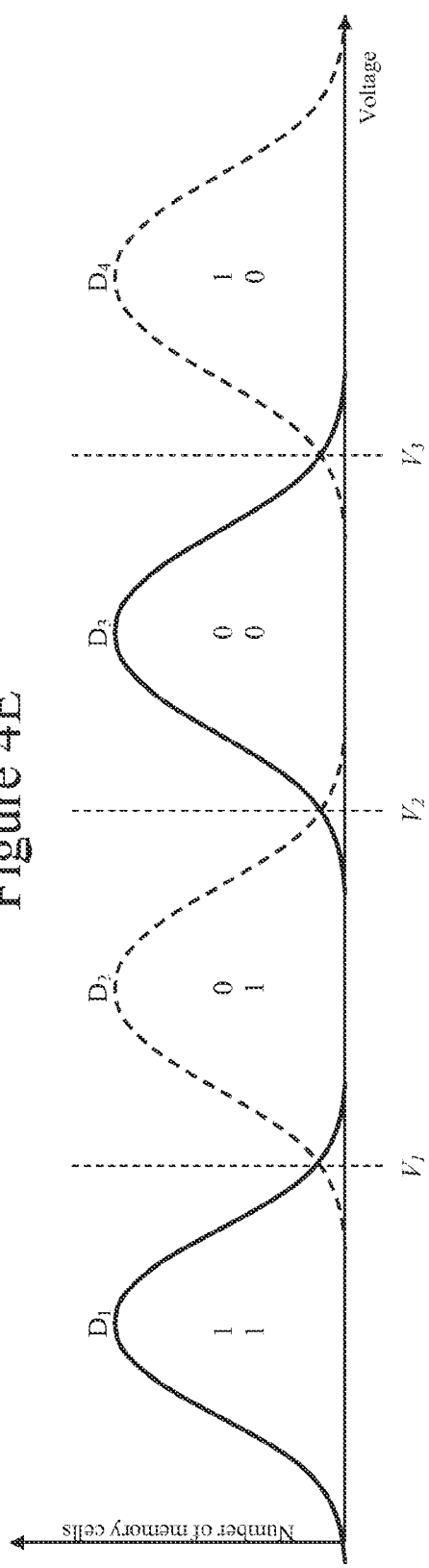
Figure 4G:
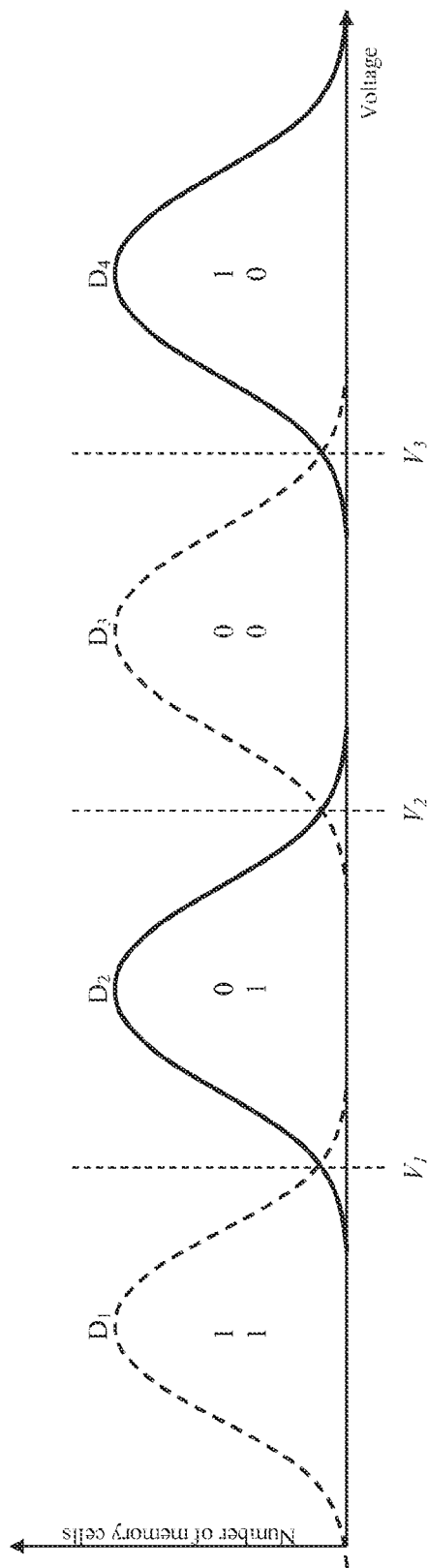
Figure 4H:
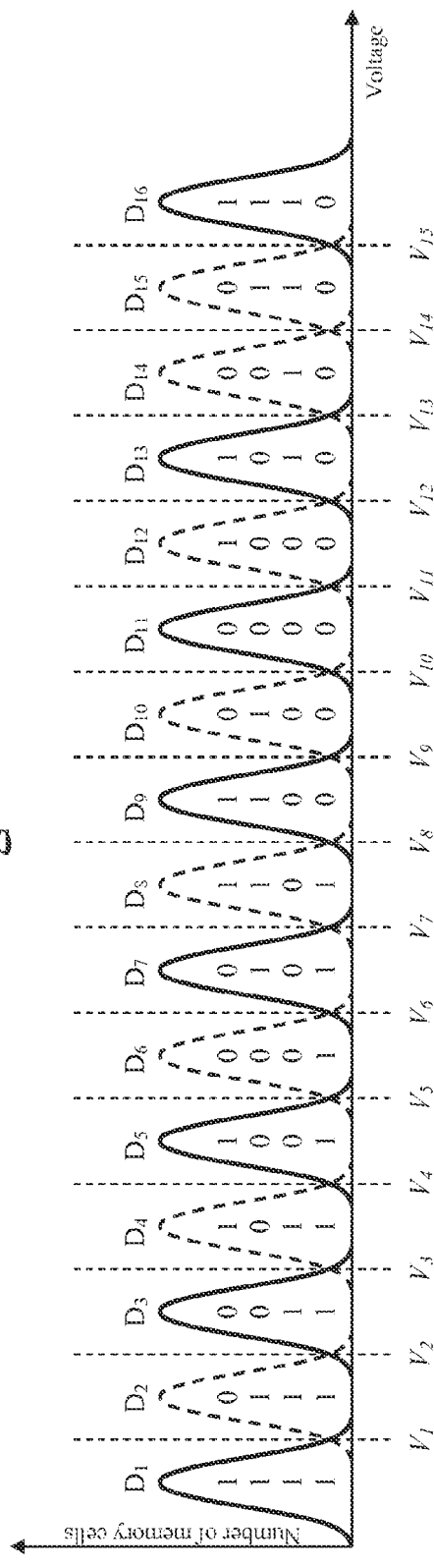
Figure 4I:
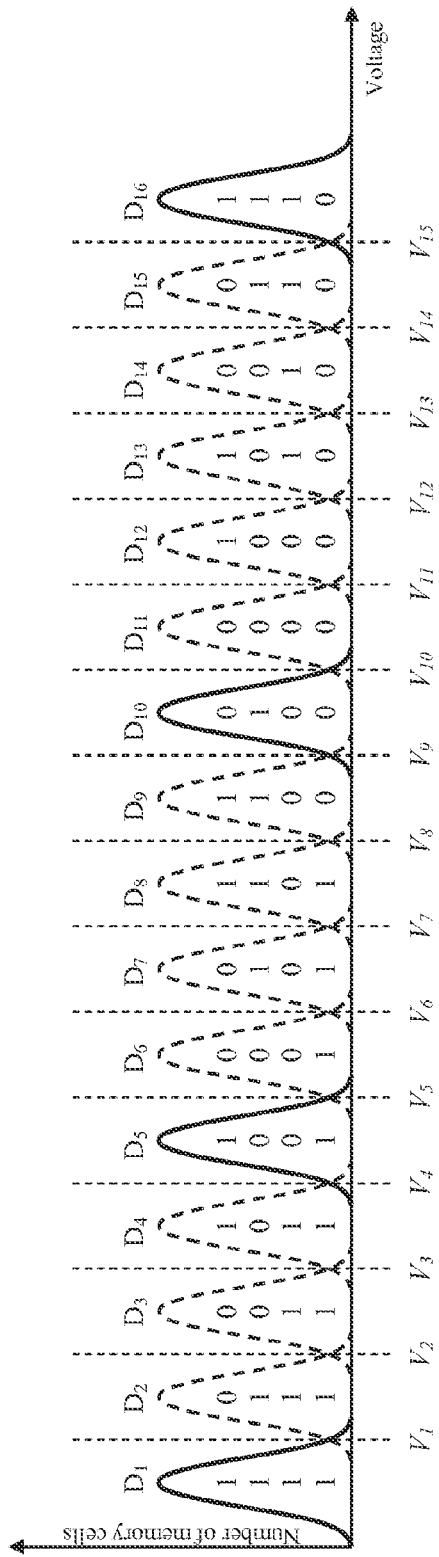
Figure 4J:
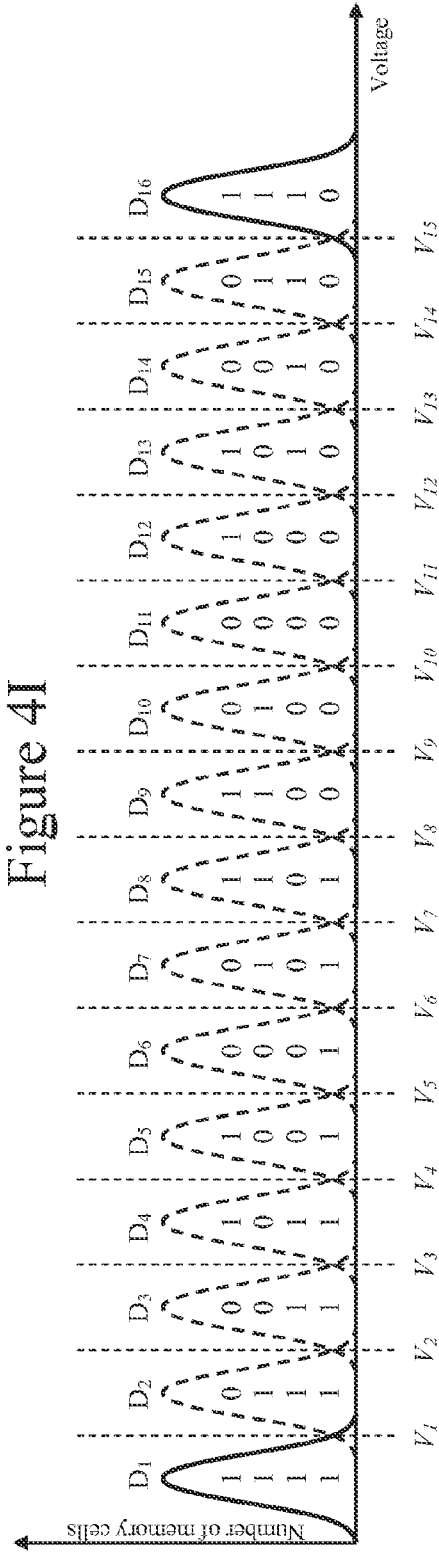
Figure 5A:
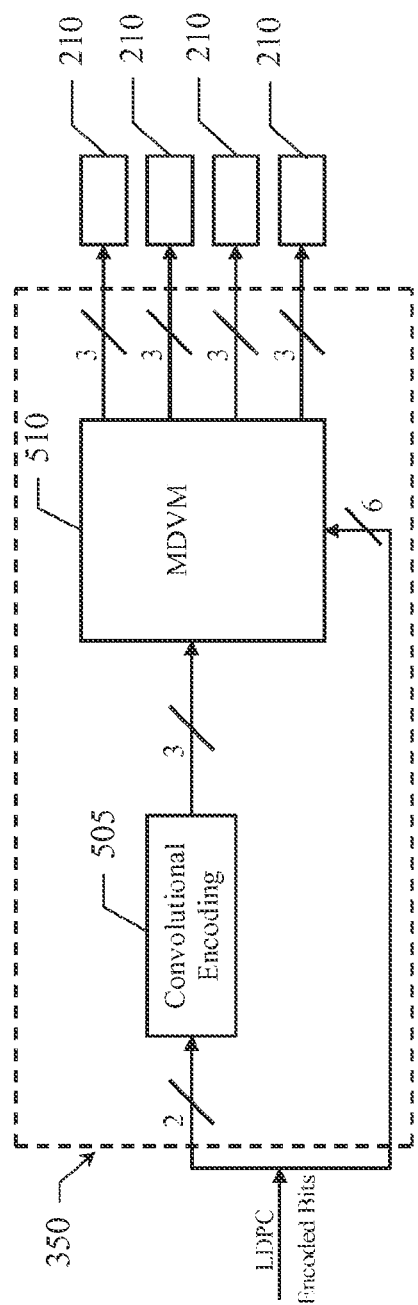
Figure 5C:
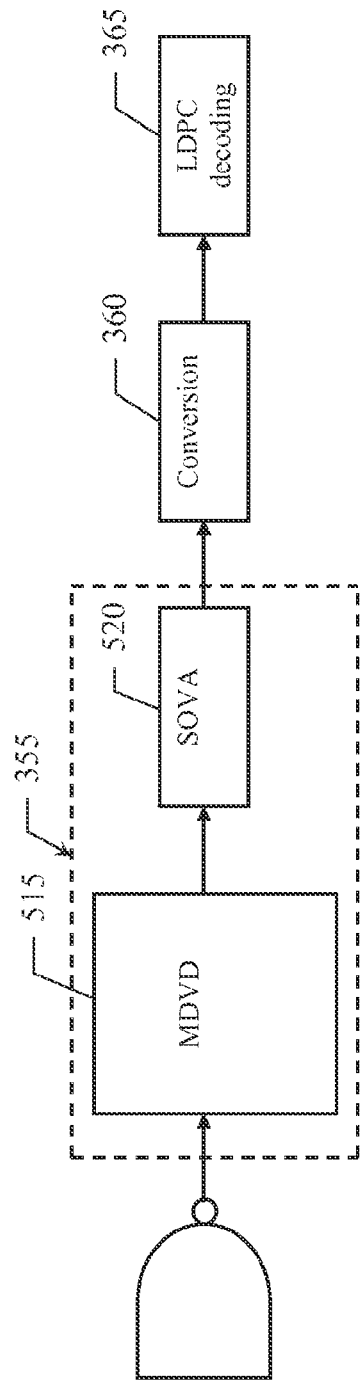
Figure 5B:
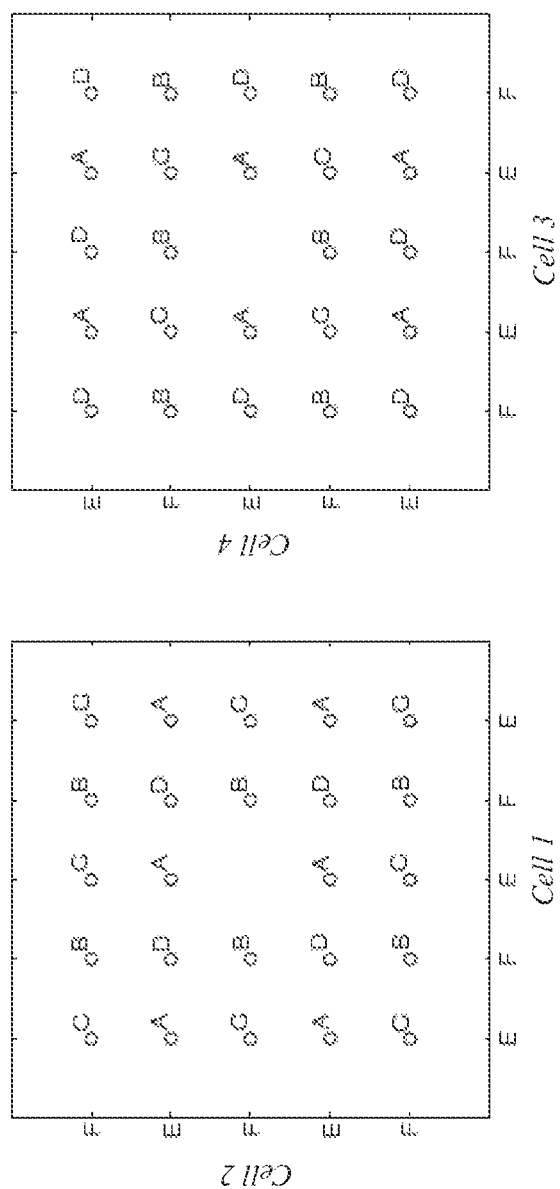

These and other features and advantages of the present invention will be made apparent by the following description of some exemplary and non-limitative embodiments thereof. For its better intelligibility, the following description should be read making reference to the attached drawings, wherein:

FIG. 1A schematically shows a simplified architecture of a SSD device known in the state of the art;

FIG. 1B schematically shows a simplified architecture of a typical SSD controller of said SSD device;

FIG. 2A schematically shows a simplified architecture of a typical flash memory die of said SSD device;

FIGS. 2B and 2C schematically show exemplary ideal and real threshold voltage distributions of MLC memory cells and of TLC memory cells, respectively, of said flash memory die;

FIG. 3A schematically shows a simplified architecture of a SSD controller according to the principles of the present invention;

FIG. 3B shows a diagram of "Raw Bit Error Rate" capability, with respect to code rate, of some exemplary ECC codes, including a "Low Density Parity Check" code that can be used in the "Forward Error Correction" unit of the SSD controller of FIG. 3A;

FIGS. 4A-4D schematically show allowed and forbidden threshold voltage distributions of TLC memory cells according to embodiments of the present invention;

FIGS. 4E-4G schematically show allowed and forbidden allowed and forbidden threshold voltage distributions of 2-bit MLC memory cells according to embodiments of the present invention;

FIGS. 4H-4J schematically show allowed and forbidden allowed and forbidden threshold voltage distributions of 4-bit MLC memory cells according to embodiments of the present invention, and FIGS. 5A, 5B and 5C schematically show a simplified architecture of a mapping unit of the SSD controller of FIG. 3A, a mapping scheme of such a mapping unit, and a simplified architecture of a demapping unit of the SSD controller of FIG. 3A, respectively, according to an embodiment of the present invention.

DETAILED DESCRIPTION OF PREFERRED EMBODIMENTS OF THE INVENTION

With reference to the drawings, FIG. 1A schematically shows a simplified architecture of a "Solid State Drive" device (SSD device) 100 known in the state of the art.

The SSD device 100 preferably comprises a controller (e.g., a processor and/or other control circuitry, referred to herein as SSD controller) 105, a plurality of non-volatile memory chips (e.g. flash memory chips, such as NAND flash memory chips) $110_i$ for storing bits even in the absence of external power supply (i=1, 2, 3, . . . , I, with I=64 in the example at issue), and a plurality of (e.g., synchronous and/or asynchronous) channels $115_j$ (j=1, 2, 3, . . . , J, with J=4 in the example at issue) communicably coupling the SSD controller 105 and the memory chips $110_i$ to each other—in the exemplary illustration, each channel 115 communicably couples the SSD controller 105 to a set of 16 memory chips $110_i$ (e.g., with the channels $115_1$, $115_2$, $115_3$ and $115_4$ that communicably couple the SSD controller 105 to the memory chips $110_1$-$110_{16}$, $110_{17}$-$110_{32}$, $110_{33}$-$110_{48}$ and $110_{49}$-$110_{64}$, respectively).

With reference also to FIG. 1B, it schematically shows, in terms of operating units, a simplified architecture of a typical SSD controller 105—the term "unit" being herein intended to emphasize functional (rather than implementation) aspects thereof. For the sake of completeness, such a figure also shows, with a smaller size, the memory chips $110_i$ and the channels $115_j$ (the memory chips and the channels being unnumbered in such a figure for ease of illustration).

The SSD controller 105 comprises a SSD interface unit 120 allowing data exchange (i.e., data sending and reception in a bi-directional way) between the SSD device 100 and a host (e.g., a host system such as a personal laptop computer, a desktop computer, a digital camera, a mobile telephone, or a memory card reader, not shown) having compatible receptors for the SSD interface unit 120. The SSD interface unit 120 may be in the form of a standardized interface. For example, when the SSD device 100 is used for data storage in a computing system, the SSD interface unit 120 can be a "Serial advanced technology attachment" (SATA), a "Peripheral Component Interconnect express" (PCIe), or a "Universal Serial Bus" (USB).

Data exchanged between the SSD device 100 (through the SSD interface unit 120 of the SSD controller 105) and the host may comprise, but are not limited to, information bits to be stored (i.e., the information bits to be written in the memory chips $110_i$), read information bits (i.e., the information bits stored in, and read from, the memory chips $110_i$), user commands indicative of the operations to be performed by the SSD controller 105 on the memory chips $110_i$ (such as write, read, diagnosis operations), and other control signals. For the purposes of the present description, the wording "data exchange", and derivative thereof, will be intended to mean a bi-directional exchange (i.e., sending and reception) of data between two units (although this should not be construed limitatively). This is also conceptually represented in the figure by bi-directional arrow connections between the units.

The SSD controller 105 also comprises a control unit 125 (or more thereof) for managing SSD device 100 operation, such as for receiving and processing the user commands from the SSD interface unit 120, handling bit transport to the memory chips $110_i$ along the channels $115_j$ and bit transport to and from the SSD interface unit 120, and coordinating enabling and/or disabling of the memory chips $110_i$ according to the user commands.

In order to compensate for large "Raw Bit Error Rate" (RBER), and to increase reliability of the SSD device 100, the SSD controller 105 also comprises a "Forward Error Correction" (FEC) unit 130 for locating and correcting bit errors. According to "Forward Error Correction" principles, the information bits to be stored in the memory chips $110_i$ (and provided either by the control unit 125 or, directly, from the SSD interface unit 105) are encoded in a redundant way (e.g., by adding parity bits) by means of an "Error Correction Code" (ECC code), so that redundancy allows detecting a limited number of bit errors that may occur anywhere in the read bits, and to correct these errors, during decoding, without rereading. The FEC unit 130 may comprise discrete components—such as an "Application Specific Integrated Circuit" (ASIC)—external to the control unit 125 (as herein assumed by way of example only), or the FEC unit 130 may reflect functionalities that do not necessarily have a discrete physical form separate from the control unit 125.

In order to ease bits transport between the SSD controller 105 and the memory chips $110_i$ along the respective channels $115_j$, the SSD controller 105 comprises one (as herein exemplary illustrated) or more memory interface units 135—alternatively, a memory interface unit 135 for each channel 115 can be provided, or a memory interface unit 135 for each memory chip $110_i$, or for each group of memory chips $110_i$ can be provided.

As conceptually depicted in the figure by (unidirectional or bi-directional) arrow connections, which however should not be construed limitatively, the memory interface unit 135 is communicably coupled in a unidirectional manner to the SSD interface 120 (e.g., for receiving from it the information bits to be written when no ECC code is requested), and in a bi-directional manner to the control unit 125 (e.g., for receiving control information from it, such as an indication of the memory chips $110_i$ to be enabled for write or read operations, and for providing to it the read bits to be transmitted to the SSD interface unit 120) and to the FEC unit 130 (for example, for receiving encoded bits from it, e.g. including the information and parity bits, and for providing to it the read bits to be decoded before transmitting to the control unit 125, and hence to the SSD interface unit 120, the read information bits).

The SSD controller 105 further comprises a memory unit (e.g., a "Random Access Memory", RAM) 140 communicably coupled (in a bi-directional manner) to the control unit 125 for receiving and storing statistical information (such as number of program/erase cycles, and number of bit errors) and/or diagnostic information (such as working temperature, power consumption) retrieved and/or calculated by the control unit 125 (e.g. based on SSD device 100 operation and/or on sensors and/or diagnostic circuits within the SSD device 100, not shown), and, when required, for feeding the control unit 125 with the stored information.

A typical flash memory chip $110_i$ may comprise one or more flash memory dice.

A typical flash memory die, illustrated in FIG. 2A and denoted by the number reference 200, comprises one (as depicted) or more memory arrays 205 of memory cells (e.g., NAND flash memory cells) 210 arranged in rows and columns. Each memory array 205 is typically divided into multiple memory pages. Broadly speaking, each memory page comprises a number of memory cells 210 that can be programmed and read simultaneously. A number of memory pages form a memory block, and the size of the memory block equals to the product of the size of the memory page and the total number of memory pages in the memory block.

In some embodiments, each memory page comprises a respective (e.g., entire) row of the memory array 205. In alternative embodiments, each row can be divided into different memory pages, either physically (for example, for each row, a memory page comprising the odd-order memory cells 210 and a memory page comprising the even-order memory cells 210), or (as herein considered and better discussed below) logically (i.e., wherein each memory cell 210 stores respective portions of different memory pages).

Each memory cell 210 comprises a floating gate transistor (not illustrated). Each bit or group of bits (or symbol, or bit pattern) identifying a respective logical state of the memory cell 210 is physically stored in each memory cell 210 in the form of electric charge in the floating gate, which defines a corresponding threshold voltage of the transistor. The number of bits each memory cell 210 is capable of storing depends on memory cell technology. For example, in "Single-Level Cell" (SLC) technology each memory cell (or SLC memory cell) is capable of storing one symbol comprising one bit (i.e. two logical states, 0 or 1, defining, i.e. being associated with, two threshold voltages), in "Multi-Level Cell" (MLC) technology each memory cell (or MLC memory cell) is capable of storing one symbol comprising more than one bit, typically two bits (i.e. four logical states, 00, 01, 10, or 11, defining, i.e. being associated with, four threshold voltages), whereas in "Tri-Level Cell" technology each memory cell (or TLC memory cell) is capable of storing one symbol comprising three bits (i.e. eight logical states, 000, 001, 010, 011, 100, 101, 110 or 111, defining, i.e. being associated with, eight threshold voltages). In the following, explicit reference will be made to SSD devices having MLC or TLC memory cells (referred to as MLC and TLC SSD devices, respectively), which the present invention is mainly intended to.

While, ideally, all memory cells 210 in the flash memory die 200 should feature same (nominal) threshold voltages for same logical states (or, equivalently, for same symbols), practically each threshold voltage associated with a corresponding logical state (or, equivalently, associated with a corresponding symbol) differs across the memory cells 210 and defines a respective threshold voltage distribution $D_j$ (typically, a Gaussian-type probability distribution), thus resulting in a number of threshold voltage distributions $D_j$ equal to the possible logical states each memory cell 210 can take. This is schematically shown in the top drawing of FIG. 2B for a MLC memory cell and in the top drawing of FIG. 2C for a TCL memory cell.

As discussed in the introductory part of this description, the threshold voltage distributions $D_j$ are (ideally) spaced apart from one another, and a corresponding reference voltage $V_k$ is set between each pair of adjacent threshold voltage distributions $D_j$ for sensing/reading the logical state of the memory cells 210 (k=1, 2, 3 in the example of FIG. 2B and k=1, 2, 3, 4, 5, 6, 7 in the example of FIG. 2C).

In the case of MLC memory cell, during a reading operation, a threshold voltage below the reference voltage $V_1$ represents the bit pattern "11", a threshold voltage between the reference voltages $V_1$ and $V_2$ represents the bit pattern "01", a threshold voltage between the reference voltages $V_2$ and $V_3$ represents the bit pattern "00", and a threshold voltage above the reference voltage $V_3$ represents the bit pattern "10". In the case of TLC memory cell, during a reading operation, a threshold voltage below the reference voltage $V_1$ represents the bit pattern "111", a threshold voltage between the reference voltages $V_1$ and $V_2$ represents the bit pattern "011", a threshold voltage between the reference voltages $V_2$ and $V_3$ represents the bit pattern "001", a threshold voltage between the reference voltages $V_3$ and $V_4$ represents the bit pattern "101", a threshold voltage between the reference voltages $V_4$ and $V_5$ represents the bit pattern "100", a threshold voltage between the reference voltages $V_5$ and $V_6$ represents the bit pattern "000", a threshold voltage between the reference voltages $V_6$ and $V_7$ represents the bit pattern "010", and a threshold voltage above the reference voltage $V_7$ represents the bit pattern "110".

To read a memory cell 210, the threshold voltage of the memory cell 210 is compared to the reference voltages $V_K$. According to an embodiment, reading a memory cell 210 that stores a bit pattern of m bits requires, for at least one page of memory cells (hereinafter, memory page), m such comparisons.

For example, when m=3, such as in the TLC memory cell, the threshold voltage is first compared to the reference voltage $V_4$. Depending on the outcome of that comparison, the threshold voltage is then compared either to the reference voltage $V_2$ or to the reference voltage $V_6$. Depending on the outcome of the second comparison, the threshold voltage is then compared either to the reference voltages $V_1$ or $V_3$ or to the reference voltages $V_5$ or $V_7$.

The two bits stored in a MLC memory cell are usually referred to as "Least Significant Bit" (LSB bit) and "Most Significant Bit" (MSB bit)—with reference to the conceptual representation of vertically arranged symbol associated with the respective threshold voltage distribution $D_j$, the LSB and MSB bits are assumed to be the bottom and top bits, respectively—whereas the three bits stored in a TLC memory cell are usually referred to as "Least Significant Bit" (LSB bit), "Center Significant Bit" (CSB bit) and "Most Significant Bit" (MSB bit)—with reference to the conceptual representation of vertically arranged symbol associated with the respective threshold voltage distribution $D_j$, the LSB, CSB and MSB bits are assumed to be the bottom, central and top bits, respectively. The terms LSB, CSB and MSB are used only as a reference to specific bits within the memory cell, and do not imply that certain bits are more important than others (in this respect, any other suitable terminology can also be used).

According to a typical implementation herein assumed, different bits in a given group of memory cells 210 correspond to different memory pages.

For example, a group of eight-logical states (TLC) memory cells 210 can be used for storing three memory pages, a first page in the LSB bits of the memory cells of the group (thus referred to as LSB page), a second page in the CSB bits of the memory cells of the group (thus referred to as CSB page), and a third page in the MSB bits of the memory cells of the group (thus referred to as MSB page). Similarly, a group of four-logical states (MLC) memory cells can be used for storing LSB and MSB pages.

Back to FIG. 2A, the memory die 200 preferably comprises peripheral circuits (such as decoders, multiplexers, drivers, buffers, sense amplifiers), which, being not relevant for the present description, are represented in the figure by means of a single functional block (denoted by the number reference 215). Such peripheral circuits 215 are configured, in general, for accessing selected (pages of) memory cells (as conceptually represented in the figure by arrow connection between the peripheral circuits 215 and the memory array 205) and for running selected operations thereon (e.g. write, read, diagnosis operations).

The increasing of the number of bits per memory cell causes, for a same threshold voltage distribution space (i.e., for the same allowed maximum and minimum threshold voltages), a higher number of threshold voltage distributions. A higher number of threshold voltage distributions in the same threshold voltage distribution space results in threshold voltage distributions that are closer to each other. This makes the memory cells more prone to suffer severe cell-to-cell interference, mainly arising from floating gate coupling effect between a target memory cell (i.e., a memory cell to be read or written) and the surrounding memory cells, and retention noise, i.e. a loss of the capability of the memory cells to retain the stored bits over time caused by progressive damage of the oxide layer (due to the high electrical fields applied at each program/erase operation) that determines an undesired flow of electrons away/in the floating gate.

Cell-to-cell interference and retention noise translate into partially overlapping areas of adjacent threshold voltage distributions $D_j$ (shown in the bottom drawings of FIGS. 2B and 2C) and, hence, into increasing of the number of bit errors per unit time (referred to as "Raw Bit Error Rate" or RBER).

With reference now to FIG. 3A, it schematically shows, in terms of operating units, a simplified architecture of a SSD controller 305 according an embodiment the present invention. For the sake of completeness, such a figure also shows, in a smaller size, the memory chips $110_i$ and the channels $115_j$ (equivalent to those illustrated in the previous figures), which identify, together with the SSD controller 305, a SSD device 300. Similarly to the above, the term "unit" is herein intended to emphasize functional (rather than implementation) aspects thereof. Indeed, without losing of generality, each unit of the SSD controller 305 may be physically implemented by software, hardware, and/or a combination thereof, and/or within any pre-existing or dedicated entity. In this respect, the operating units are also intended to represent corresponding method steps of a method according to the present invention.

As visible in the figure, the SSD controller 305 comprises, similarly to the SSD controller 105, a SSD interface 320, a SSD control unit 325, a memory interface unit 335, and a memory unit 340, which will not be discussed again for the sake of conciseness.

The SSD controller 305 also comprises an encoding unit 345 for encoding the bits to be stored in the memory array 205 (i.e., the information bits) by means of an ECC code. According to an embodiment of the present invention, the encoding unit 345, and the respective decoding unit (discussed in the following), are implemented in the FEC unit 130.

Preferably, the ECC code is an ECC code allowing soft decoding—or, otherwise stated, an ECC code that allows determining each bit value (hard decoding) as well as each bit reliability in terms of soft bits. More preferably, the ECC code is a "Low-Density Parity-Check" (LDPC) code—hence, the encoding unit 345 will be referred to as LDPC encoding unit 345 and the corresponding encoded bits will be referred to as LDPC encoded bits.

LDPC code is a linear ECC code (constructed by using a sparse bipartite graph) that allows transmitting data over a noisy channel. LDPC code is a capacity-approaching code, which means that practical constructions exist that allow the noise threshold to be set very close to the theoretical maximum (the Shannon limit given by the Shannon theorem) for a symmetric memory-less channel.

The Shannon theorem specifies the maximum rate at which data can be transmitted over a channel of a specified bandwidth in the presence of noise. More specifically, according to the Shannon theorem, a bound on the maximum amount of error-free data that can be transmitted with a specified bandwidth in the presence of the noise interference is set, assuming that the signal power is bounded, and that the Gaussian noise process is characterized by a known power or power spectral density. The noise threshold defines an upper bound for the channel noise, up to which the probability of data errors can be made as small as desired.

Thanks to soft decoding allowed by LDPC code, for a given code rate (the ratio between the information bits to the (LDPC, in the case at issue) encoding unit and the total number of bits created by the encoding unit, the total number of bits created by the encoding unit including the parity bits), LDPC code approaches the Shannon limit more than ECC codes typically used in prior art solutions (such as BCH codes), which translates into area saving while maximizing the probability of accurately recovering the bits after a reading operation.

This is illustrated in FIG. 3B, which shows a diagram of "Raw Bit Error Rate" capability, with respect to code rate, of LDPC code and of different BCH codes. In the figure it is also plotted the Shannon limit.

As visible in the figure, given a code rate of 0.9, LDPC code approaches the Shannon limit more than BCH code, whereas the same RBER can be achieved by means of the BCH code only with a code rate of 0.75 (which implies a 25% area overhead).

According to an embodiment, LDPC is a variable rate LDPC code, so that it may change the code rate depending on the RBER. Advantageously, the variable rate LDPC code is a "Quasi-Cyclic Low Density Parity Check" (QC LDPC) code. Broadly speaking, a QC LDPC code has a parity check matrix that is composed of circulant matrices of the same size. Each circulant matrix is a square matrix wherein each row is one degree of right-cyclic shift of the row above it (so that the first row is also the right-cyclic shift of the last row), and wherein each column is one degree of downward-cyclic shift of the column on the left (so that the first column is also the downward-cyclic shift of the rightmost column).

Thus, by enabling different rows/columns of the circulant matrices, the number of parity bits within the circulant matrices may be kept the same while changing the number of information bits within the circulant matrices, thus implying code rate changing. Alternatively, by splitting the rows and introducing a number of all zero circulant matrices, the number of parity bits within the circulant matrices may be changed, so that the parity check matrix becomes more sparse (and the number of parity bits and information bits, and hence the code rate, is changed).

Back to FIG. 3A, the SSD controller 305 also comprises a mapping unit 350 for "mapping" the LPDC encoded bits into mapped LDPC encoded bits (the mapped LDPC encoded bits representing the symbols to be written/programmed), thereafter the symbols can be stored in the memory chips $110_i$ (e.g., similarly to the above, by means of the memory interface unit 335 that transmits the symbols to the memory chips $110_i$, and thanks to control unit 325 action that controls addressing of the memory chips $110_1$ to be written/programmed). Preferably, as also conceptually illustrated by arrow connections between the SSD control unit 325, the encoding unit 345, the mapping unit 350, and the memory interface unit 335, the mapping unit 350 (and, hence, the mapping operation performed by it) can be selectively enabled by the control unit 325, and hence the LDPC encoded bits may be fed directly to the memory interface unit 335 when the mapping unit 350 is disabled. According to an embodiment of the present invention, selective enabling of the mapping unit 350 takes place after a predetermined number of detected failures (e.g., bit errors). Additionally or alternatively, selective enabling of the mapping unit 350 can take place after a predetermined working period of the SSD device 300 from its first use (e.g., after the program/erase cycles stored in the memory unit 340 reaches a predetermined number), e.g. in order to compensate for decreasing performance affecting the SSD device 300 with its use.

The SSD controller 305 further comprises a demapping 355 and LDPC decoding 365 units for carrying out demapping and decoding operations to the read symbols in order to extract the information bits therefrom (the demapping and LDPC decoding operations being substantially reverse operations with respect to the encoding and mapping operations carried out at LDPC encoding 345 and mapping 350 units, respectively).

As better discussed in the following, the demapping unit 355 and the control unit 325 are configured to cooperate with each other (see arrow connection between the demapping unit 355 and the control unit 325) such as to provide an indication of the reliability of the read symbols.

The LDPC decoding unit 365 is configured to perform a soft decoding of the read symbols according to said indication of the reliability of the read symbols thereby obtaining the information bits. Since, in order to work properly, the LDPC decoding unit 365 requires, for each read bit, a "Log Likelihood Ratio" (LLR, hereinafter, LLR value) associated with that bit (i.e., a weight indicative of the probability that the read bit is correct), said indication of the reliability of the read symbols is preferably provided (by the control unit 325) to the LDPC decoding unit 365 in the form of LLR values.

Roughly speaking, the symbols to be written in the memory cells are determined in the mapping unit 350 based on a plurality of (e.g., predefined or dynamically determined) allowed symbols that the memory cells are allowed to store. The allowed symbols are a subset of the possible symbols, so that one or more forbidden symbols not allowed to be stored in the memory cells are defined among the possible symbols, and used by the demapping unit 355 for basing said indication of the reliability of the read symbols (as better discussed below).

In other words, among the possible symbols each memory cell is designed to store, a subset of the possible symbols is actually allowed to be stored in the memory cells, the remaining possible symbols representing instead the forbidden symbols. As better understood herebelow when discussing practical examples, the fact that the allowed symbols are a subset of the possible symbols implies that only some (e.g., one or more) memory pages among the possible memory pages the memory cells could theoretically store are available for storing information (hereinafter, available memory pages)—i.e. the memory cells are written according to their (e.g., MLC or TLC) cell technology, but only the bits carrying the information of the available memory pages will be considered as valid information.

According to an embodiment, the plurality of allowed symbols that the memory cells are allowed to store (and, hence, the resulting one or more forbidden symbols) are predetermined/fixed, and aware of the mapping unit 350 (for mapping the LDPC encoded bits onto the allowed symbols), of the demapping unit 355 (for demapping the read symbols based on the allowed and forbidden symbols), and of the control unit 325 (e.g., for providing the LLR values that ensure an accurate subsequent decoding, as better discussed below).

Additionally or alternatively, the plurality of allowed symbols that the memory cells are allowed to store (and, hence, the resulting one or more forbidden symbols) are determined (e.g., by the control unit 325) and dynamically updated according to any proper criterion. By way of example only, dynamical updating of the allowed (and forbidden) symbols may take place in such a way to converge towards admitted RBER and/or UBER. According to an embodiment of the present invention, dynamical updating of the allowed (and forbidden) symbols takes place at control unit 325 side, thereafter the updated allowed (and forbidden) symbols are communicated to the mapping 350 and demapping 355 units. According to an alternative embodiment of the present invention, dynamical updating of the allowed (and forbidden) symbols takes place at mapping unit 325 side, thereafter the updated allowed (and forbidden) symbols are communicated to the control 325 and demapping 355 units. Both these embodiments are conceptually suggested in FIG. 3A by bidirectional arrow connections among the control 325, mapping 350 and demapping 355 units.

Thanks to the forbidden symbols, a robust indication of the reliability of the read symbols is provided. Indeed, according to an embodiment of the present invention, for each read symbol equal to a forbidden symbol, the demapping unit 355 can provide to the control unit 325 an indication that the read symbol read from a memory cell is different from the original symbol, i.e. the symbol (among the allowed symbols) originally stored in that memory cell, thereafter the control unit 325 can process such an indication (as detailed below) and translate it into LLR values to be fed to the decoding unit 365.

According to an embodiment of the present invention, said indication of the reliability of the read symbols comprises, for each read symbol equal to a forbidden symbol, an indication of the probability that the original symbol is one of the allowed symbols. This translates into proper LLR values for the bits of the read symbols (for example, higher LLR values for those bits of the read symbols belonging to the allowed symbols, and lower LLR values for those bits of the read symbols belonging to the forbidden symbols).

Preferably, the fact that at least one (at most, each) allowed symbol is adjacent to at least one forbidden symbol is used to determine, with a certain degree of confidence, the original symbol as one of the allowed symbols adjacent the forbidden symbol incorrectly read from a memory cell. Even more preferably, as better discussed herebelow in connection with practical examples of allowed and forbidden symbol patterns, this is achieved by the control unit 325 according to at least one between a parameter indicative of a floating gate coupling effect and a parameter indicative of a retention effect that affect the memory cells.

According to an embodiment of the present invention, for each group of memory cells (e.g., memory pages or memory blocks) the parameter indicative of a floating gate coupling effect is expressed by means of a number of write and erase operations occurred on that group of memory cells (hereinafter referred to as FEC parameter), whereas the parameter indicative of the retention effect is expressed by means of a time between write and read operations occurred on that group of memory cells (hereinafter referred to as retention time).

With reference now to FIGS. 4A-4D, they schematically show allowed and forbidden threshold voltage distributions (associated with allowed and forbidden symbols, respectively) for TLC memory cells, according to embodiments of the present invention. In such figures $D_j$ denote the possible threshold voltage distributions of each TLC memory cell (similarly to FIG. 2C), whereas the dashed and continuous lines identify the forbidden and allowed threshold voltage distributions, respectively.

Preferably, as illustrated in these figures, the forbidden threshold voltage distributions are defined according to a criterion of maximization of distance between the allowed threshold voltage distributions, and, even more preferably, such that each allowed threshold voltage distribution is adjacent to one or more forbidden threshold voltage distributions. This allows reducing the number of bit errors, and hence the UBER, in the SSD device 300, as the overlapping regions between the allowed threshold voltage distributions are strongly reduced, or almost avoided.

In the examples of FIGS. 4A-4D, four allowed threshold voltage distributions and four forbidden threshold voltage distributions are provided, among the eight possible threshold voltage distributions $D_j$. This equals to say that, in these examples, the TLC memory cells of the SSD device 300 are dealt as MLC memory cells, as only two bits per memory cell are considered as valid information—however, practically, the TLC memory cells are still TLC memory cells by the program/erase standpoint, i.e. they are programmed and erased as conventional TLC memory cells, i.e. by storing three bits per memory cell, but in the reading phase only two of the three bits are considered, with the remaining bits that are instead disregarded.

Preferably, as assumed from now on, the two (of three) bits per memory cell that are considered as valid information are the LSB and CSB bits; this is an advantageous design option that takes into account that, typically, in order to ensure both high programming accuracy and speed, the bits are written in a progressive manner to the memory cells from the LSB bits to the MSB bits.

With reference first to the practical example of FIG. 4A, the allowed threshold voltage distributions are $D_1$, $D_4$, $D_6$ and $D_8$ (and the allowed symbols are 111, 101, 000 and 110) whereas the forbidden threshold voltage distributions are $D_2$, $D_3$, $D_5$ and $D_7$ (and the forbidden symbols are 011, 001, 100 and 010).

If a read symbol is associated with a forbidden threshold voltage distribution, for example the threshold voltage distribution $D_5$, the demapping unit 355 provides to the control unit 325 an indication that the read symbol, i.e. the read symbol 100 in the example at issue, is different from the originally stored symbol.

At this point, as mentioned above, the control unit 325 may translate such an indication into LLR values to be fed to the decoding unit 365. The LLR values can be determined by the control unit 325 by assuming that the original symbol was any of the allowed symbols (i.e. by assigning equal or similar LLR values to all the allowed symbols). In its turn, the decoding unit 365 will use these LLR values (possibly, together with further LLR values, as detailed below when discussing an embodiment of the demapping unit 355) for soft decoding the read symbols into the information bits.

Alternatively, as mentioned above, the control unit 325 may establish, with a certain degree of confidence, whether the original symbol was one among the allowed symbols whose threshold voltage distributions are closest (adjacent) to the threshold voltage distribution associated with the read forbidden symbol under evaluation—i.e., in the example at issue, whether the original symbol was the allowed symbol associated with the adjacent allowed threshold voltage distribution $D_4$ (i.e., the allowed symbol 101) or the allowed symbol associated with the adjacent allowed threshold voltage distribution $D_6$ (i.e., the allowed symbol 000)—by using the FEC parameter and the retention time, and providing such information to the decoding unit 365 in the form of LLR values.

In the example at issue wherein the forbidden threshold voltage distribution $D_5$ (and the associated forbidden symbol 100) is under evaluation, the following two (opposite) main cases i) and ii) may be identified (it being understood that other cases may be identified according to the FEC parameter, the retention time and the specific allowed and forbidden symbol pattern):

Case i)
if the retention time for the memory cell storing the forbidden symbol 100 is zero, a high probability exists that the original symbol is not the allowed symbol 000 (i.e., the allowed symbol associated with the allowed threshold voltage distribution $D_6$); and
if the FEC parameter indicates that the memory cell storing the forbidden symbol 100 has been disturbed to a certain extent by the neighboring memory cells, a certain probability that the original symbol is the allowed symbol 101 (i.e., the allowed symbol associated with the allowed threshold voltage distribution $D_4$).

Case ii)

if the retention time for the memory cell storing the forbidden symbol 100 is sufficiently different from zero, a high probability exists that the original symbol is not the allowed symbol 101 (i.e., the allowed symbol associated with the allowed threshold voltage distribution $D_4$); and if the FEC parameter indicates that the memory cell storing the forbidden symbol 100 has not been significantly disturbed by the neighboring memory cells, a certain probability that the original symbol is the allowed symbol 000 (i.e., the allowed symbol associated with the allowed threshold voltage distribution $D_6$).

In other words, when trying to establish which is the original symbol (among the allowed symbols adjacent to the read forbidden symbol under evaluation), the forbidden threshold voltage distribution (i.e., the threshold voltage distribution associated with the read forbidden symbol, the forbidden threshold voltage distribution $D_5$ in the example at issue) acts as a "monitoring distribution" for the adjacent allowed threshold voltage distributions (i.e., the threshold voltage distributions associated with the adjacent allowed symbols, the allowed threshold voltage distributions $D_4$ and $D_6$ in the example at issue) and the FEC parameter and the retention time are used to determine the most likely "direction" along which the original symbol has "moved" to the read forbidden symbol—indeed, the higher the retention time for a memory cell, the higher the probability that the bits stored therein move towards their default state, i.e. the erase state (bit at the logical level 1), whereas the higher the floating gate coupling effect, the higher the probability of a spourious programming of the bits stored therein from the logical level 1 to the logical level 0.

In the same way, in the example of FIG. 4A, the threshold voltage distribution $D_7$ acts as a monitoring distribution for the allowed threshold voltage distributions $D_6$ and $D_8$, whereas the threshold voltage distributions $D_2$ and $D_3$ act as monitoring distributions for the allowed threshold voltage distributions $D_1$ and $D_4$.

The present invention, applied to consumer TLC SSD devices, allows obtaining MLC SSD devices featuring UBER of the order of $10^{-16}$ or less, which is comparable to performance that is expected in enterprise applications. This translates into high reliability and lifetime of the SSD device in terms of sustainable program/erase cycles, as well as in a significant cost reduction for SSD devices for enterprise applications. Moreover, thanks to the present invention it is possible to respond to shortage that typically affect enterprise SSD devices supply chains, as consumer SSD devices, whose availability is always high, can be used with same performance as enterprise SSD devices.

Furthermore, as LDPC decoding does not require multiple reading operations (or a high number thereof), improved read access times are obtained.

With reference now to FIGS. 4B and 4C, they show, according to embodiments of the present invention alternative to that of FIG. 4A, allowed and forbidden threshold voltage distribution patterns of TLC memory cells aimed at achieving an enterprise MLC SSD device from (i.e., by means of) a consumer TLC SSD device.

In the embodiment of FIG. 4B, the allowed threshold voltage distributions are $D_1$, $D_3$, $D_5$ and $D_8$ (and the allowed symbols are 111, 001, 100 and 110) whereas the forbidden threshold voltage distributions are $D_2$, $D_4$, $D_6$ and $D_7$ (and the forbidden symbols are 011, 101, 000 and 010). Such a pattern, comprising two monitoring distributions $D_6$ and $D_7$ before the last allowed threshold voltage distribution $D_8$ of the succession, is advantageous when it is required to mitigate the retention effect (whose impact is more significant for those threshold voltage distributions, such as the allowed threshold voltage distribution $D_8$, associated with high values of reference voltages $V_k$).

In the embodiment of FIG. 4C, the allowed threshold voltage distributions are $D_2$, $D_4$, $D_6$ and $D_8$ (and the allowed symbols are 011, 101, 000 and 110) whereas the forbidden threshold voltage distributions are $D_1$, $D_3$, $D_5$ and $D_7$ (and the forbidden symbols are 111, 001, 100 and 010). Such a pattern is advantageous when it is required to mitigate the floating gate coupling effect, whose impact is more significant for those threshold voltage distributions (such as the threshold voltage distribution $D_1$) whose stored bits can not be recovered by means of re-program techniques—indeed, in order to store the symbol 111 in a TLC memory cell (or the symbol 11 in a 2-bit MLC memory cell, or the symbol 1111 in a four-bit MLC memory cell, and so on), that memory cell is not programmed.

With reference now to FIG. 4D, it shows, according to an embodiment of the present invention, an allowed and forbidden threshold voltage distribution pattern of a TLC memory cell aimed at achieving an enterprise SLC SSD device from (i.e., by means of) a consumer TLC SSD device. In this embodiment, the allowed threshold voltage distributions are $D_1$ and $D_8$ (and the allowed symbols are 111 and 110) whereas the forbidden threshold voltage distributions are $D_2$, $D_3$, $D_4$, $D_5$, $D_6$ and $D_7$ (and the forbidden symbols are 011, 001, 101, 100, 000 and 010). This embodiment is advantageous as allows maximizing the distance between the allowed threshold voltage distributions (and, hence, avoiding at all overlapping regions), however other patterns may be envisaged (e.g., as discussed above, based on the effects, including the floating gate coupling effect and/or the retention effect, to be mitigated).

Similarly to the above, FIGS. 4E-4G show, according to embodiments of the present invention, allowed and forbidden threshold voltage distribution patterns aimed at achieving an enterprise SLC SSD device from (i.e., by means of) a consumer MLC SSD device, and FIGS. 4H, 4I and 4J show, according to embodiments of the present invention, allowed and forbidden threshold voltage distribution patterns aimed at achieving, respectively, enterprise TLC, MLC and SLC SSD devices, respectively, from (i.e., by means of) a consumer 4-bit MLC SSD device.

As should be readily apparent, the examples of FIGS. 4A-4J have been made in connection with the principles of the present invention, it being understood that, according to the practical implementation of the SSD controller 105 (i.e., of one or more units thereof), many changes are possible.

By way of example only, the practical implementation of the mapping unit 350 (and, hence, of the demapping unit 355) may result in a different number of allowed and forbidden threshold voltage distributions of the pattern (as detailed below).

With reference to FIG. 5A, it schematically shows a simplified architecture of the mapping unit 350 according an embodiment of the present invention. In this embodiment, a mapping unit 350 configured to achieve a MLC SSD device from a TLC SSD device will be only discussed for the sake of conciseness, it being understood that same considerations also apply mutatis mutandis for achieving a SLC SSD device from a TLC SSD device, a SLC SSD device from a MLC device, or a SLC/MLC/TLC SSD device from a 4-bit MLC SSD device.

In the considered embodiment, the mapping unit 350 is based on a N-dimensional mapping scheme (for example, a 4-Dimensional, or 4-D, mapping scheme).

According to the N-Dimensional mapping scheme, an arbitrary N-dimensional arbitrary constellation is first partitioned into a number of subsets. The LDPC encoded bits (from the LDPC encoding unit 345) input to the mapping unit 350 in each N-dimensional symbol interval is divided into two portions (or groups) of bits. A first group of bits is input to an N-dimensional k/k+1 convolutional encoding unit 505, which applies to them a convolutional code (i.e., a type of ECC code that generates convolutionally encoded bits, hereinafter parity bits, via the sliding application of a Boolean polynomial function), and whose output parity bits are used to identify an N-dimensional subset of the constellation. The parity bits are used to help mapping whose purpose is to write potentially interfering symbols over the memory cells as far as possible from each other. A second group of bits of the LDPC encoded bits remains instead (convolutionally) uncoded and is used to further specify an N-dimensional symbol from the identified N-dimensional subset. The first and second groups of bits are supplied to an N-dimensional "Maximum Distance Voltage Mapping" unit 510 (hereinafter, MDVM unit), which converts them into an N-dimensional symbol or J P-dimensional points, where J and P are integers whose product equals N.

In the example at issue, for each set of 8 LDPC encoded bits (to be stored in four memory cells 210), the convolutional code is applied only to the first 2 LDPC encoded bits of that set, and the corresponding parity bits are fed to the MDVM unit 510, whereas the remaining 6 LDPC encoded bits are fed to the MDVM unit 510 directly (and used to generate a subset composed by $2^6$ points).

According to an embodiment, the N-dimensional k/k+1 convolutional encoding unit 505 is a 2/3 convolutional encoding unit (the three parity bits being used to select the subset out of $2^3$ subsets), which introduces a redundancy in terms of parity bits.

In order to separate as much as possible the symbols and to avoid writing this redundancy, five symbols are required—as conceptually shown in FIG. 5A at the output of the MDVM unit 510, wherein four symbols each one of three bits (instead of two bits) are provided (to be written in a group of, e.g. four, memory cells 210).

In the example at issue of 4-D mapping scheme and of 9 bits input to the MDVM unit 510, the MDVM unit 510 maps $2^9$ points into a 4-D constellation.

In order to achieve that, as shown in FIG. 5B, each 2-Dimensional (2-D) constellation (corresponding to each one of the memory cells 210, referred to as Cell 1, Cell 2, Cell 3 and Cell 4 in the figure) is partitioned in two subsets, denoted by E and F, then each 2-Dimensional (2-D) constellation is partitioned in four subsets, namely A=(E,E), B=(F,F), C=(E,F), and D=(F,E).

Finally, the 4-D constellation is partitioned in eight 4-D subsets, each one containing 64 4-D points, as shown in the table below.

Since each dimension has 5 levels (i.e., symbols), the 4-D constellation contains $5^4$ points, from which $2^9$ points for mapping are chosen. Preferably, as also shown in FIG. 5B, in each 2-D constellation only 24 of the total 25 points are considered. More preferably, this is achieved by discarding the central point, which means that no input is mapped to the central point.

4-D mapping is constructed hierarchically by taking two 2-D mapping. Each 4-D subset is the union of two 4-D types, and each 4-D type is constructed by two 2-D subsets. For example, in both 2-D constellations, the subsets A both have 6 points, so the 4-D type (A, A) have 36 points. Similarly, 2-D subsets B both have 6 points, so the 4-D type (B,B) have 36 points. 32 points from the 4-D type (A,A) and 32 points from the 4-D type (B,B) are taken to form the 4-D subset $P_1$ which contains 64 points. The construction of each 4-D subset is illustrated in the following table. Under each 4-D type is a pair of numbers. The first number denotes how many 4-D points are in this 4-D type, while the second number denotes how many points are considered from this 4-D type for mapping.

| 4-D subset | Concatenation form |
|---|---|
| $P_1$ | (A, A) ∪ (B, B) |
|  | (36→32) ∪ (36→32) |
| $P_2$ | (C, C) ∪ (D, D) |
|  | (32→32) ∪ (32→32) |
| $P_3$ | (A, B) ∪ (B, A) |
|  | (36→32) ∪ (36→32) |
| $P_4$ | (C, D) ∪ (D, C) |
|  | (64→64) ∪ (16→0) |
| $P_5$ | (A, C) ∪ (B, D) |
|  | (24→16) ∪ (48→48) |
| $P_6$ | (C, B) ∪ (D, A) |
|  | (48→48) ∪ (24→16) |
| $P_7$ | (A, D) ∪ (B, C) |
|  | (48→48) ∪ (24→16) |
| $P_8$ | (C, A) ∪ (D, B) |
|  | (48→48) ∪ (24→16) |

As mentioned above, in order to separate as much as possible the symbols and to avoid writing this redundancy, five symbols are required. As a result of that, five different threshold voltages are required for this embodiment. In order to achieve that, only five threshold voltages among the eight threshold voltages (and, hence, only five threshold voltages distributions among the eight threshold voltages distributions) of a TLC SSD device are used (i.e., the TLC SSD device is dealt as a MLC SSD device). In other words, in a TLC flash memory device the required five symbols (resulting from the above mapping operations) represent, actually, the allowed symbols, among the eight possible symbols, that are allowed to be written in the four target memory cells. Thus, as mentioned above, the considered mapping scheme implies a number (five, in the example at issue) of allowed symbols (and allowed threshold voltage distributions) different from that discussed in connection with the principles of the present invention.

As discussed above, the fact that the number of allowed symbols is lower than the number of possible symbols equals to say that, in order to comply with the above-discussed criterion of maximization of distance, a number of forbidden symbols (i.e., logical states or bit patterns) are set for the target memory cells (the forbidden symbols being not allowed to be written in the target memory cells). The fact that the number of allowed symbols is lower than the number of the possible symbols the memory cell is designed to store (the symbols to be stored being still a subset of the allowed symbols, as in the MLC memory cell case), which translates into the presence of the forbidden symbols, can allow introducing a high distance among the threshold voltage distributions, depending on the pattern of the allowed and forbidden symbols. According to an embodiment, in the scenario herein considered wherein the possible symbols define a succession of possible symbols (with adjacent possible symbols of the succession that differ from each other for one bit), the pattern of the allowed and forbidden symbols may be defined such that at least one allowed symbol of the plurality of allowed symbols is adjacent to a respective forbidden symbol. In the example herein considered of TLC memory cell, each forbidden symbol may be set adjacent to at least one allowed symbol of said five allowed symbols in order to comply with said criterion of maximization of distance.

Thus, by virtue of the UBER improvement that combined action of LPDC encoding/decoding and mapping/demapping allow achieving, any consumer TLC flash memory device may be made comparable, in terms of performance, to an enterprise MLC SSD device, while keeping the low costs of the consumer TLC SSD device.

With reference now to FIG. 5C, a demapping unit 355 according to an embodiment of the present invention is schematically shown.

The demapping unit 355 comprises a Maximum Distance Voltage Demapping unit 515 (hereinafter, MDVD unit) performing reverse operations with respect to the MDVM unit 510, and a "Soft Output Viterbi Algorithm" (SOVA) unit 520. SOVA algorithm differs from the conventional Viterbi algorithm in that it takes into account the a priori probabilities of the input symbols, and produces a soft output indicating the reliability of the decision.

Thus, the demapping unit 355 according to this exemplary embodiment outputs soft bits representing metrics indicative of distances among the threshold voltage distributions, hereinafter metric soft bits. For this reason, in this embodiment a conversion unit 360 is advantageously provided between the demapping unit 355 and the LDPC decoding unit 365 (as illustrated in FIG. 3A) for converting the metric soft bits into further LLR values (the further LLR values representing additional information with respect to the LLR values determined by the control unit 325 when one or more read symbols match forbidden symbols, and allowing to further improve LDPC decoding). Provision of the conversion unit 360 allows implementing the demapping unit 355 by means of known architectures, without that changes or modifications to their operation are required.

Thanks to the MDVD unit 515 and the SOVA unit 520, four memory cells are read and the further LLR values (obtained from the metric soft bits in the conversion unit 360 as discussed below) are fed to the LDPC decoding unit 365. Thus, according to the present invention the soft bits do not derive, as instead is in the known solutions discussed in connection with FIGS. 2B and 2C, from multiple reading operations (by moving the reference voltages), which makes LDPC decoding dependent by only a limited number (five, in the considered example) of (hard) threshold voltages, and hence simpler.

The metrics represented by the metric soft bits is not limiting for the present invention. According to an embodiment of the present invention, the metrics are voltage levels indicative of the distances among the threshold voltage distributions associated with the read symbols. By way of example only, in the case of a first threshold voltage at −1V and a second threshold voltage at 1V, and a read threshold voltage at 0.5V, the metrics for the first and second threshold voltages could be 1.5V and 0.5V, respectively. In the considered embodiment, the LLRs could be determined in the conversion unit 360 as the logarithmic ratio between the metrics (thereafter, the computed LLRs are input to the LDPC decoding unit 365). In the case of multiple (i.e., more than two) threshold voltages, and hence of resulting multiple metrics, the LLRs could be determined in the conversion unit 360 as the logarithmic ratio between the relevant metrics (for example, the closest metrics).

Naturally, in order to satisfy local and specific requirements, a person skilled in the art may apply to the present invention as described above many logical and/or physical modifications and alterations. More specifically, although the present invention has been described with a certain degree of particularity with reference to preferred embodiments thereof, it should be understood that various omissions, substitutions and changes in the form and details as well as other embodiments are possible. In particular, different embodiments of the invention may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the invention may be incorporated in any other embodiment.

What is claimed is:

1. A controller for a solid state drive, wherein the solid state drive comprises memory cells each one for storing a symbol among a plurality of possible symbols that the memory cell is designed to store, and wherein the controller comprises:
   an encoding unit for encoding information bits into encoded bits;
   a mapping unit for mapping the encoded bits into said symbols, wherein said symbols are determined based on a plurality of allowed symbols that the memory cells are allowed to store, said plurality of allowed symbols being a subset of the plurality of the possible symbols such that a plurality of forbidden symbols not allowed to be stored in the memory cells are defined among the plurality of the possible symbols,
   a demapping unit for demapping read symbols and for providing an indication of the reliability of the read symbols based on said plurality of forbidden symbols, and
   a soft decoding unit for soft decoding the read symbols according to said indication of the reliability of the read symbols thereby obtaining said information bits.

2. The controller according to claim 1, wherein said indication of the reliability of the read symbols comprises, for each read symbol equal to a forbidden symbol of said plurality of forbidden symbols, an indication that the read symbol read from a memory cell is different from an original symbol originally stored in that memory cell.

3. The controller according to claim 2, wherein said indication of the reliability of the read symbols further comprises, for each read symbol equal to a forbidden symbol of said plurality of forbidden symbols, an indication of the probability that the original symbol is one of the plurality of the allowed symbols.

4. The controller according to claim 3, wherein the plurality of possible symbols define a succession of possible symbols, adjacent possible symbols of the succession differing from each other for one bit, and wherein at least one of the at least one allowed symbol of said plurality of allowed symbols is adjacent to at least one of the plurality of forbidden symbols, said indication of the probability that the original symbol is one of the plurality of allowed symbols comprising an indication of the probability that the original symbol is one of the at least one allowed symbol adjacent that forbidden symbol.

5. The controller according to claim 4, wherein said indication of the probability that the symbol originally stored is one of the at least one allowed symbol adjacent the forbidden symbol is provided according to at least one between an indication of a floating gate coupling effect and an indication of a retention effect that affect the memory cells.

6. The controller according to claim 1, wherein each memory cell comprises a floating gate transistor adapted to store a symbol, among the plurality of possible symbols, when programmed at a threshold voltage associated with that symbol, each threshold voltage being variable over the memory cells thereby defining a corresponding threshold voltage distribution, and wherein said plurality of forbidden symbols are defined according to a criterion of maximization of distance between the threshold voltage distributions associated with the allowed symbols of said plurality of symbols.

7. The controller according to claim 1, further comprising a convolutional encoding unit for convolutionally encoding a first portion of the encoded bits into convolutionally encoded bits, said mapping unit being based on a 4-Dimensional mapping scheme applied to said convolutionally encoded bits and to a second portion of the encoded bits not convolutionally encoded.

8. The controller according to claim 1, wherein said demapping unit comprises a "Soft Output Viterbi Algorithm" (SOVA) unit.

9. The controller according to claim 1, wherein said encoding unit and said soft decoding unit are based on a "Low Density Parity Check" (LDPC) code.

10. The controller according to claim 1, wherein said encoding unit and said soft decoding unit are based on a "Quasi-Cyclic Low Density Parity Check" (QC LDPC) code.

11. A solid state drive comprising:
  memory cells each one for storing a symbol among a plurality of possible symbols that the memory cell is designed to store,
  an encoding unit for encoding information bits into encoded bits;
  a mapping unit for mapping the encoded bits into said symbols, wherein said symbols are determined based on a plurality of allowed symbols that the memory cells are allowed to store, said plurality of allowed symbols being a subset of the plurality of the possible symbols such that a plurality of forbidden symbols not allowed to be stored in the memory cells are defined among the plurality of the possible symbols,
  a demapping unit for demapping read symbols and for providing an indication of the reliability of the read symbols based on said plurality of forbidden symbols, and
  a soft decoding unit for soft decoding the read symbols according to said indication of the reliability of the read symbols thereby obtaining said information bits.

12. The solid state drive according to claim 11, wherein said indication of the reliability of the read symbols comprises, for each read symbol equal to a forbidden symbol of said plurality of forbidden symbols, an indication that the read symbol read from a memory cell is different from an original symbol originally stored in that memory cell.

13. The solid state drive according to claim 12, wherein said indication of the reliability of the read symbols further comprises, for each read symbol equal to a forbidden symbol of said plurality of forbidden symbols, an indication of the probability that the original symbol is one of the plurality of the allowed symbols.

14. The solid state drive according to claim 13, wherein the plurality of possible symbols define a succession of possible symbols, adjacent possible symbols of the succession differing from each other for one bit, and wherein at least one of the at least one allowed symbol of said plurality of allowed symbols is adjacent to at least one of the plurality of forbidden symbols, said indication of the probability that the original symbol is one of the plurality of allowed symbols comprising an indication of the probability that the original symbol is one of the at least one allowed symbol adjacent that forbidden symbol.

15. The solid state drive according to claim 14, wherein said indication of the probability that the symbol originally stored is one of the at least one allowed symbol adjacent the forbidden symbol is provided according to at least one between an indication of a floating gate coupling effect and an indication of a retention effect that affect the memory cells.

16. The solid state drive according to claim 11, wherein each memory cell comprises a floating gate transistor adapted to store a symbol, among the plurality of possible symbols, when programmed at a threshold voltage associated with that symbol, each threshold voltage being variable over the memory cells thereby defining a corresponding threshold voltage distribution, and wherein said plurality of forbidden symbols are defined according to a criterion of maximization of distance between the threshold voltage distributions associated with the allowed symbols of said plurality of symbols.

17. The solid state drive according to claim 11, further comprising a convolutional encoding unit for convolutionally encoding a first portion of the encoded bits into convolutionally encoded bits, said mapping unit being based on a 4-Dimensional mapping scheme applied to said convolutionally encoded bits and to a second portion of the encoded bits not convolutionally encoded.

18. The solid state drive according to claim 11, wherein said demapping unit comprises a "Soft Output Viterbi Algorithm" (SOVA) unit.

19. The solid state drive according to claim 11, wherein said encoding unit and said soft decoding unit are based on a "Low Density Parity Check" (LDPC) code.

20. The solid state drive according to claim 11, wherein said encoding unit and said soft decoding unit are based on a "Quasi-Cyclic Low Density Parity Check" (QC LDPC) code.

21. The solid state drive according to claim 11, wherein the memory cells are flash memory cells.

22. The solid state drive according to claim 11, wherein said memory cells are NAND flash memory cells.

* * * * *